United States Patent
Dzienis et al.

(10) Patent No.: US 10,228,408 B2
(45) Date of Patent: Mar. 12, 2019

(54) METHOD, DEVICE AND SYSTEM FOR DETERMINING THE FAULT LOCATION OF A FAULT ON A LINE OF AN ELECTRICAL ENERGY SUPPLY NETWORK

(71) Applicant: SIEMENS AKTIENGESELLSCHAFT, Munich (DE)

(72) Inventors: Cezary Dzienis, Dallgow-Doeberitz (DE); Andreas Jurisch, Schwante (DE)

(73) Assignee: Siemens Aktiengesellschaft, Munich (DE)

( * ) Notice: Subject to any disclaimer, the term of this patent is extended or adjusted under 35 U.S.C. 154(b) by 121 days.

(21) Appl. No.: 15/465,802

(22) Filed: Mar. 22, 2017

(65) Prior Publication Data

US 2017/0276718 A1    Sep. 28, 2017

(30) Foreign Application Priority Data

Mar. 22, 2016   (EP) .................................. 16161729

(51) Int. Cl.
  *G01R 31/08*   (2006.01)
  *H03H 7/01*    (2006.01)
(52) U.S. Cl.
  CPC ......... *G01R 31/086* (2013.01); *G01R 31/085* (2013.01); *G01R 31/088* (2013.01); *H03H 7/0138* (2013.01)
(58) Field of Classification Search
  CPC ... G01R 31/086; G01R 31/085; G01R 31/088
  USPC ....................................................... 324/522
  See application file for complete search history.

(56) References Cited

U.S. PATENT DOCUMENTS

| | | | |
|---|---|---|---|
| 4,996,624 | A  | 2/1991 | Schweitzer, III |
| 5,929,642 | A  | 7/1999 | Philippot et al. |
| 8,655,609 | B2 | 2/2014 | Schweitzer, III et al. |
| 2006/0012374 | A1 | 1/2006 | Kojovic et al. |

(Continued)

FOREIGN PATENT DOCUMENTS

| EP | 2476002 B1     | 5/2015 |
|----|----------------|--------|
| WO | 2012126526 A1  | 9/2012 |

OTHER PUBLICATIONS

Li Xiaqing, et al.: "Operating State Monitoring and Fault Diagnosis on Traction Power Supply System", 2008, pp. 866-870.

(Continued)

*Primary Examiner* — Reena Aurora
(74) *Attorney, Agent, or Firm* — Laurence Greenberg; Werner Stemer; Ralph Locher

(57) ABSTRACT

The fault location of a fault on a line of an electrical energy supply network is determined. First and second current and/or voltage values are measured and provided with a timestamp at the line ends of the line. Following the occurrence of a fault, the timestamped first and second values are used to determine the fault location. Profiles of travelling waves propagating along the line towards the line ends when the fault occurs are determined from the timestamped first and second values at both line ends. The fault location is defined from the profiles of the travelling waves from a time difference with which the travelling waves arrive at the two line ends. The time difference is derived from a pattern comparison of the profiles of the travelling waves determined for the line ends.

16 Claims, 13 Drawing Sheets

(56) References Cited

U.S. PATENT DOCUMENTS

| | | |
|---|---|---|
| 2013/0096854 A1 | 4/2013 | Schweitzer, III et al. |
| 2015/0081234 A1* | 3/2015 | Schweitzer, III .... G01R 31/088 702/58 |
| 2015/0081235 A1* | 3/2015 | Schweitzer, III .... G01R 31/088 702/59 |
| 2015/0081236 A1 | 3/2015 | Schweitzer, III et al. |
| 2015/0204935 A1* | 7/2015 | Klonowski .......... G01R 31/086 702/59 |

OTHER PUBLICATIONS

Cansin Y. Evrenosoglu, et al.: "Bewley Diagrams Revisited via Visualization", 2009, pp. 1401-1407.

Sepehr Sefidpour, et al.: "Factors Affecting Traveling Wave Protection", 2011, pp. 1359-1365.

\* cited by examiner

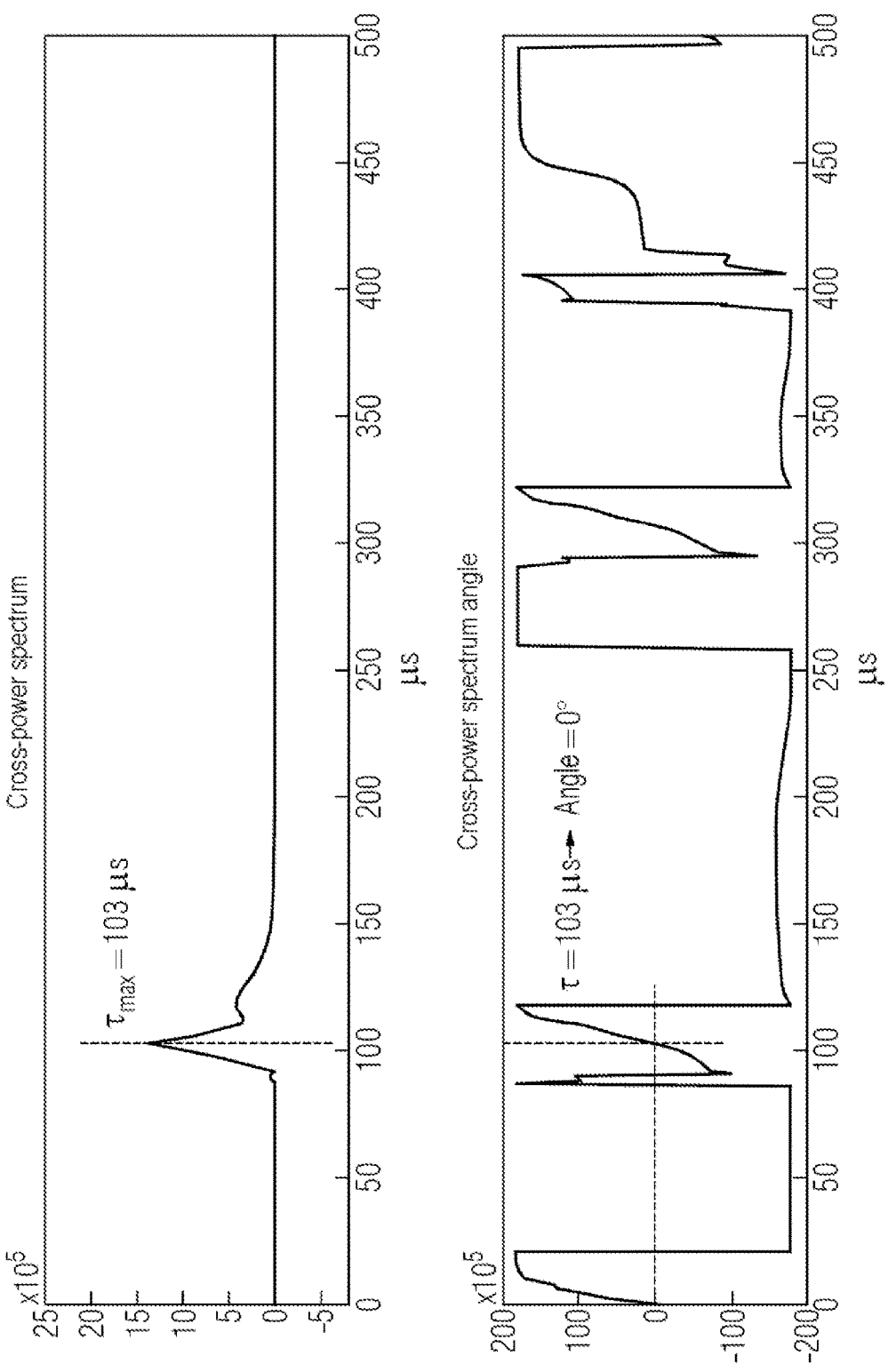

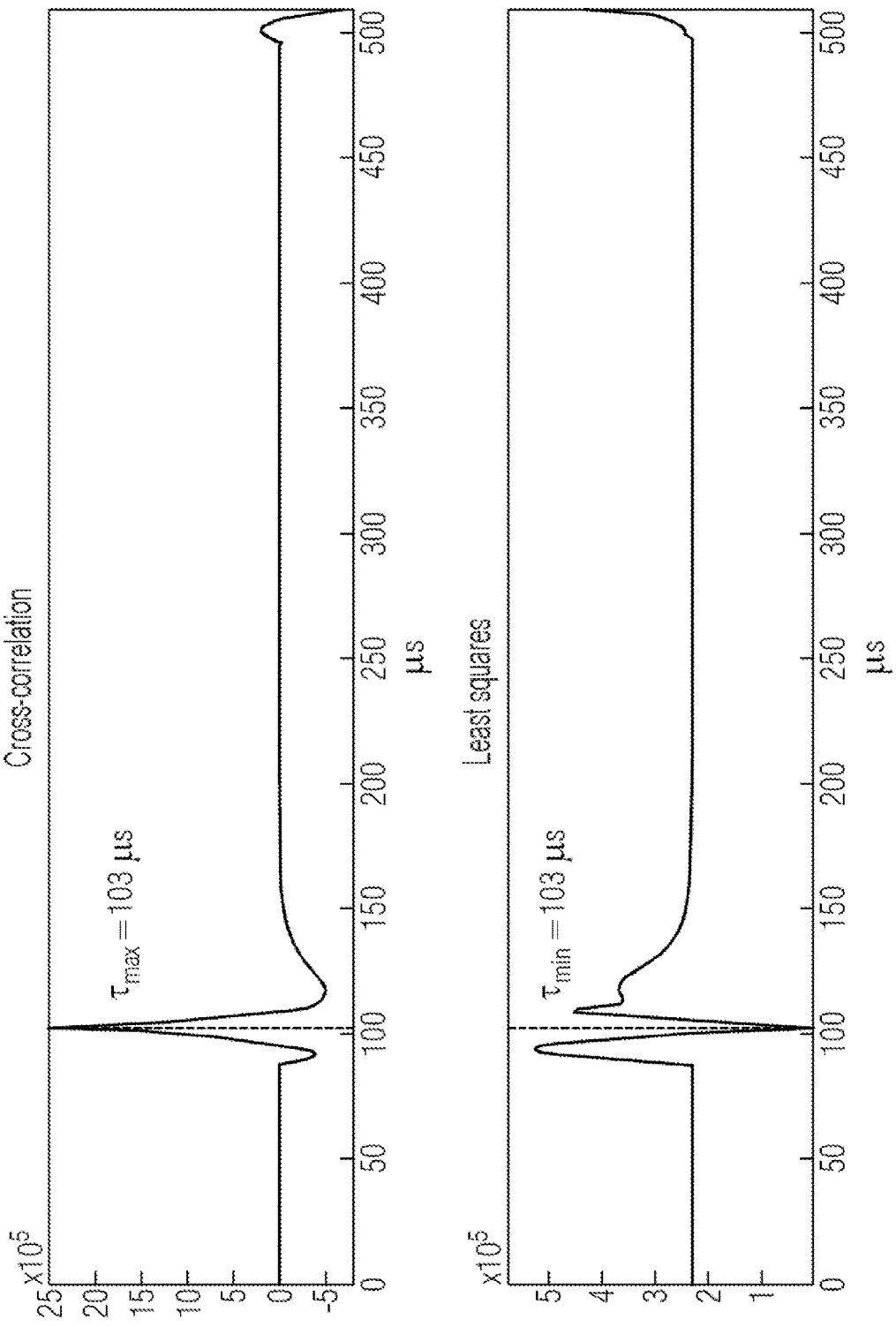

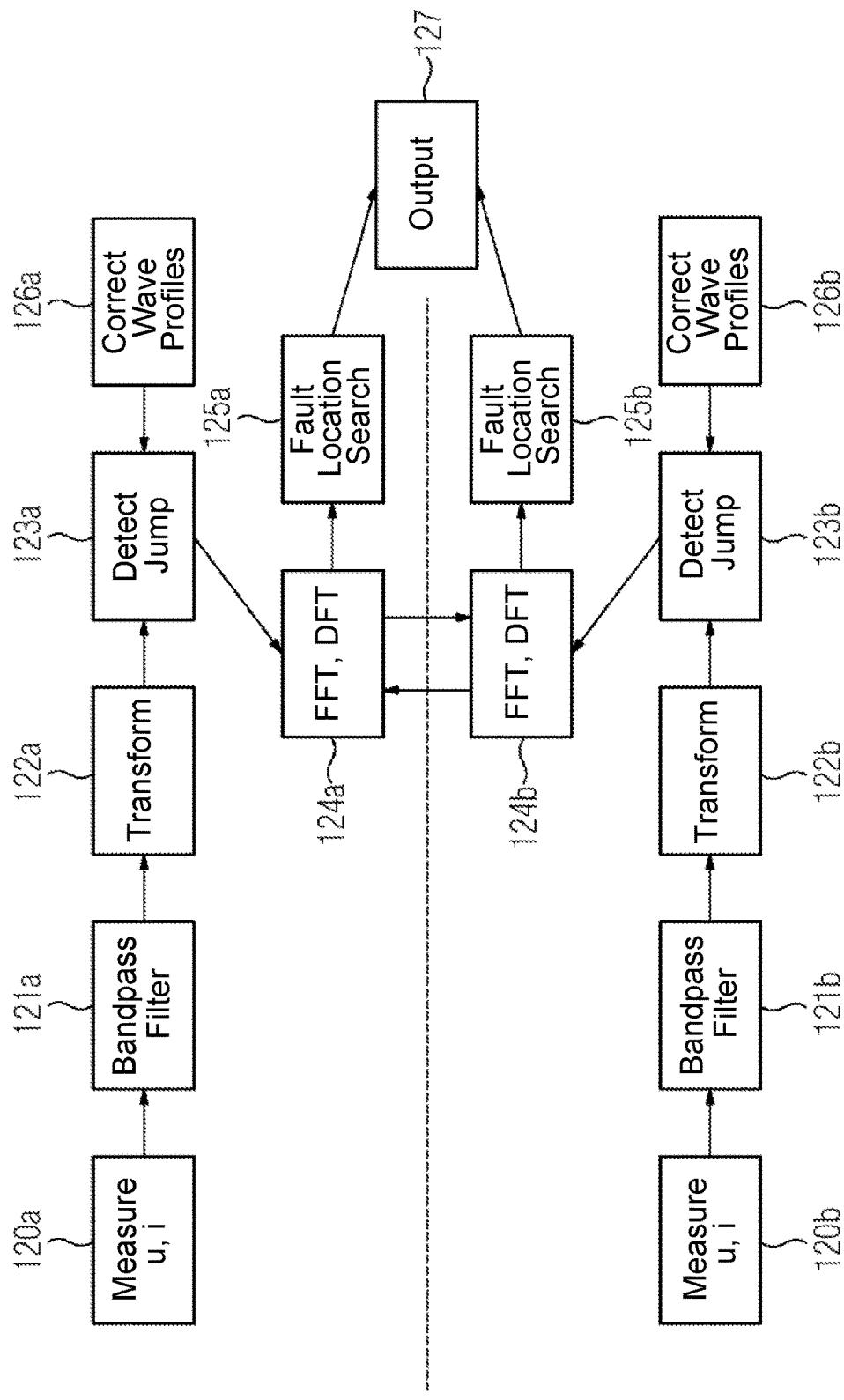

METHOD, DEVICE AND SYSTEM FOR DETERMINING THE FAULT LOCATION OF A FAULT ON A LINE OF AN ELECTRICAL ENERGY SUPPLY NETWORK

CROSS-REFERENCE TO RELATED APPLICATION

This application claims the priority, under 35 U.S.C. § 119, of European patent application EP 16161729.5, filed Mar. 22, 2016; the prior application is herewith incorporated by reference in its entirety.

BACKGROUND OF THE INVENTION

Field of the Invention

The invention relates to a method for determining the fault location of a fault on a line of an electrical energy supply network in which first current and/or voltage values are measured and provided with a timestamp at a first line end of the line, second current and/or voltage values are measured and provided with a timestamp at a second line end of the line, and the fault location of said fault is defined using the timestamped first and second current and/or voltage values following the occurrence of a fault on the line.

The invention also relates to a corresponding device and a system for determining the fault location of a fault on a line of an electrical energy supply network.

The safe operation of electrical energy supply networks requires the fast and reliable detection and shutdown of any faults, such as, for instance, short circuits or ground faults. Causes of faults which result in a shutdown may, for example, be lightning strikes, torn or otherwise damaged lines, defective insulations in cable lines or the unwanted contact of overhead lines with animal or plant parts. In order to shorten fault-related downtimes, faults of this type must be localized as accurately as possible in order to enable an elimination by a maintenance team of the fault cause and any consequential damage caused by the fault.

In the simplest, but also most expensive, case, a fault is located by means of visual inspection. The maintenance team passes along the defective line and examines it for visible fault points. This procedure is slow and prone to error.

A different procedure has therefore largely been adopted, whereby the fault location at which the fault on the line is located is isolated by means of an analysis of measurement values, for example, currents and voltages measured during the fault occurrence. A plurality of different methods have since become known for this purpose, the accuracy of which impacts significantly on the maintenance cost of the energy supply network. Great importance is therefore attached to improving the accuracy of the algorithms used for the fault location in order to simplify the maintenance and, in particular, shorten fault-related downtimes of the energy supply network.

A rough result of the fault location can be achieved, for example, by identifying the fault direction. This method is used primarily in compensated, isolated and high-impedance-grounded energy supply networks with a radial structure or a low degree of meshing. A wattmetric method, for example, can be used, as known from the European Patent EP 2476002 B1. A different method for detecting the fault direction is the "wiper relay principle" which is known in one possible embodiment, for example, from the international patent application WO 2012/126526 A1. However, an additional evaluation is necessary in these methods for more accurate fault location.

Methods for more accurate fault location use, for example, the measured current and voltage signals of the fundamental wave (50 Hz or 60 Hz signals) for fault location. Here, methods are known which use measured values of only one of the line ends (unilateral fault location) or measured values of both line ends (bilateral fault location). As a result, the fault location is normally indicated as the distance from the respective measuring point (as a percentage of the line or in km or miles).

In the case of the use of measured values of only one line end, the cost of performing the fault location is low. This fault location method is primarily an impedance-based method in which an impedance through to the fault location is calculated from current and voltage measured values. The fault location can be inferred through comparison with the line impedance of the entire line in the fault-free case. An example embodiment of a fault location method of this type can be found, for example, in U.S. Pat. No. 4,996,624.

The accuracy of this method depends, inter alia, heavily on the measurement accuracy of the current and voltage transformers that are used, the accuracy of the line parameters used for the fault location (e.g. impedance per unit length) and on the given fault conditions (e.g. fault resistance, load) and the network characteristics. Faults and the transient responses in the current and voltage signals can have a negative impact on the accuracy of this method. The resulting measurement errors may amount to several percent.

An improved accuracy in the fault location can be achieved through the use of measured values from both line ends. Here, the fault-location-related measured values must be collated via a suitable communication connection. In this context, reference is made to U.S. Pat. No. 5,929,642; in the method described there, a fairly high accuracy (measurement error approximately 1-2%) is achieved in the fault location using current and voltage measured values from both line ends by means of estimation methods and non-linear optimization methods.

Whereas the accuracy of the fault location in the case of impedance-based fault location methods depends on the measurement accuracy of the measuring transformers that are used and the network characteristics, a broad independence from these values can be achieved through the use of a fault location method according to the "travelling wave fault location" principle. According to this principle, the transient signal components produced in the event of a fault and occurring in the form of "travelling waves" are taken into consideration for the fault location instead of the measured current and voltage signals. Here, the high-frequency travelling wave edges are measured and provided with a timestamp. Since the propagation speed of the travelling waves is approximately equal to the speed of light, the fault can be accurately located from the evaluation of the timestamping. Accuracies in the region of a few dozen meters can be achieved with this fault location method. An example of a fault location method of this type can be found in U.S. Pat. No. 8,655,609 B2.

SUMMARY OF THE INVENTION

It is accordingly an object of the invention to provide a method, a device and a system for fault localization which overcomes the above-mentioned and other disadvantages of the heretofore-known devices and methods of this general type and which allows to perform a fault location with measured values from both line ends with even higher accuracy.

With the foregoing and other objects in view there is provided, in accordance with the invention, a method for determining the fault location of a fault on a line of an electrical energy supply network, the method comprising:

measuring first values selected from the group consisting of current values and voltage values at a first line end of the line and providing the first values with a timestamp;

measuring second values selected from the group consisting of current values and voltage values at a second line end of the line and providing the second values with a timestamp; and following an occurrence of a fault on the line, determining profiles of travelling waves propagating along the line in a direction of the line ends using the timestamped first and second values at both line ends; and determining the fault location from the profiles of the travelling waves determined for both line ends by defining a time difference with which the travelling waves arrive at the first and second line ends, respectively, the time difference being defined from a pattern comparison of the profiles of the travelling waves determined for the line ends.

In other words, the objects of the invention are achieved by a method of the aforementioned type in which, using the timestamped first and second current and/or voltage values on both line ends, profiles of travelling waves propagating along the line in the direction of the line ends when the fault occurs are determined and the fault location is defined from the profiles of the travelling waves determined for both line ends by defining a time difference with which the travelling waves arrive at the two line ends, wherein the time difference is defined from a pattern comparison of the profiles of the travelling waves determined for the line ends.

Since the fault location is not based on the edge definition of the travelling waves alone, but a profile of the travelling waves, and therefore a longer characteristic of measured values is taken into account, the time difference with which the travelling waves arrive at both line ends can be defined with comparatively high accuracy. The fault location can be inferred in a simple manner from the time difference.

The timers (e.g. internal clocks of measuring devices) used for the time stamping of the current and/or voltage measured values at both line ends are temporally synchronized with one another in the method according to the invention, so that the timestamps allocated at the two line ends are comparable with one another.

According to one advantageous embodiment of the method according to the invention, it can be provided that a cross-correlation of the profiles is carried out for the pattern comparison of the profiles of the travelling waves. Alternatively or additionally, it can also be provided that an angle of the cross-power spectrum of the profiles of the travelling waves is used for the pattern comparison.

A maximum of the correspondence of the profiles of the travelling waves can be obtained using the cross-correlation. The use of the angle of the cross-power spectrum can be used as an additional or independent criterion.

Alternatively, according to a different advantageous embodiment of the method according to the invention, it can also be provided that a minimization of a target function formed from the difference between the profiles of the travelling waves is carried out for the pattern comparison.

With this procedure also, the optimum overlap of the profiles of the travelling waves of the two line ends can be obtained in order to infer the time difference of the arrival of the travelling waves from it.

According to a further advantageous embodiment of the method according to the invention, it can be provided that a correction of the profile of the travelling wave of at least one line end is carried out before the pattern comparison, wherein an attenuation of the line is taken into account.

As a result, a fault location can also be carried out in an advantageous manner with high accuracy, even in lines in which, due to their length and/or material properties, losses in terms of measured values cannot be ignored.

A further advantageous embodiment of the method according to the invention furthermore provides that the fault location is defined exclusively using current and voltage values which have been measured at both line ends during the occurrence of a first wave pulse of a travelling wave.

As a result, the quantity of measured values to be transmitted can be significantly reduced, since complete fault records do not have to be transmitted, but only the measured value characteristics during the first pulse of the travelling wave. In this context, a first individual wave crest, a first individual wave trough or the combination of a first wave crest and a first wave trough are regarded as the first pulse of the travelling wave. A further advantage of this approach is that the first wave pulse is not yet overlaid by reflection effects from the other line end and the calculation of the profile of the travelling wave can therefore be performed comparatively more simply. A reduction of the measured values to be transmitted is particularly advantageous if a fault location is to be performed in real time (online fault location), whereas, in a subsequent fault location (offline fault location), more time is usually available for the fault location and a longer time duration can be accepted for the measured value transmission.

In order to further reduce the measured values to be transmitted, it is furthermore regarded as advantageous if the fault location is defined exclusively using either current values or voltage values which have been measured at the two line ends during the occurrence of a first wave pulse of a travelling wave.

This embodiment of the method according to the invention is based on the realization that a fault location is usually still possible with relatively high accuracy even if exclusively current or voltage measured values are used to define the profiles of the travelling waves.

According to a further advantageous embodiment of the method according to the invention, it is provided that the current and voltage values measured at the line ends are subjected to a filtering, wherein first and second filtered current and voltage values are formed which indicate a selected frequency range of the measured current and voltage values, and the profiles of the traveling waves are defined using the first and second filtered current and voltage values.

As a result, only the signal components that are relevant to the traveling waves are advantageously determined and used for the fault location. In this embodiment, only selected signal components of the current and voltage measured values are then used in a suitable frequency range for the fault location according to the filter design.

Specifically, it can be provided in this respect that the selected frequency range comprises high-frequency transient components or band-limited transient components of the measured current and voltage values.

It can furthermore be provided in this context that the filter characteristic of the filter used to filter the current and voltage measured values dampens the frequency ranges in which current and voltage transformers used to measure the current and voltage measured values have measurement errors.

In this way, measurement errors caused by current and voltage transformers can be particularly effectively suppressed.

In this context, it can furthermore be provided that, in the case of a multiphase electrical energy supply network, in respect of the first and second filtered current and voltage values, a mathematical transformation is performed to decouple the individual phase components, wherein first and second transformed current and voltage values are formed, and the profiles of the travelling waves are defined using the first and second transformed current and voltage values.

As a result, the method according to the invention can advantageously be used in—commonplace—multiphase energy supply networks. The measured values of the individual phases are decoupled by the mathematical transformation and can be more simply evaluated. A modal transformation, for example, such as the Clarke transformation or an eigenvalue transformation can be considered for the transformation.

A further advantageous embodiment of the method according to the invention furthermore provides that the determination of the fault location is carried out if a jump which exceeds a predefined threshold has been identified in the characteristic of the first current and voltage values or values derived therefrom and/or in the characteristic of the second current and voltage values or values derived therefrom.

In this way, the fault location method is carried out only in the case of an abrupt characteristic change, such as e.g. in an actually occurring fault event, since the jump in the characteristic of the current and voltage measured values or values derived therefrom (e.g. the aforementioned filtered or transformed current and voltage values) normally associated with the fault triggers the performance of the fault location method. Furthermore, the jump detection is used for the correct positioning of the measurement window for the evaluation to determine the fault location.

In order to be able to make a distinction in this context between a fault event that has actually occurred on the line and other events which cause abrupt characteristic changes, the fault distance x determined with the fault location method is evaluated. If this distance is within the line length, i.e. typically between 0 and 1, a fault event is present on the line that is to be monitored; conversely, if it is outside the line, no fault on the line can be assumed.

A further advantageous embodiment of the invention furthermore provides that the determination of the fault location is carried out in each case by means of a device at each of the line ends, and the fault locations determined with the devices are output by the devices.

Here, the fault location determination is carried out at both line ends, in fact on the basis of the same measured values, but nevertheless independently from one another, as a result of which two results of the fault location determination are generated. Partially different algorithms can also be executed in the devices; for example, different optimization methods can be used. The reliability of the result can be inferred from the correspondence of the results from both line ends. The fault location determined at the respective line end may be displayed directly on the device e.g. as a percentage of the line length or as a distance from the respective measuring point (e.g. in km or miles) or may be output in the form of a signal or data message and forwarded to an operator of the energy supply network. The devices at both line ends may, for example, be protective devices for monitoring the line for faults which are normally present in any case.

Alternatively, however, it may also be provided that the determination of the fault location is carried out by means of a device configured for this purpose, and the determined fault location is output by the device.

This device may be provided at one of the line ends or may be designed as a central device, e.g. a data processing device in a station or network control center. The determined fault location may, for example, be displayed directly on the device as a percentage of the line length or as a distance from a selected measuring point (e.g. in km or miles) or may be output in the form of a signal or data message and forwarded to an operator of the energy supply network.

With the above and other objects in view there is also provided a device for determining the fault location of a fault on a line of an electrical energy supply network. The novel device has a processing device, or processor, which is configured to determine the fault location of the fault using first current and/or voltage values measured and timestamped at a first line end of the line and second current and/or voltage values measured and timestamped at a second line end of the line following the occurrence of a fault on the line.

It is provided here according to the invention that the processing device is configured to determine profiles of travelling waves propagating along the line in the direction of the line ends when the fault occurs, using the timestamped first and second current and voltage values at both line ends, and that the processing device is configured to define the fault location from the profiles of the travelling waves determined for both line ends by defining a difference with which the travelling waves arrive at the two line ends, wherein the time difference is defined from a pattern comparison of the profiles of the travelling waves determined for the line ends.

Here, the device may advantageously be formed by an electrical protection device which, along with the fault location, performs further protection and monitoring functions for the electrical energy supply network (e.g. a distance protection function, an overcurrent protection function or a differential protection function for the line). Alternatively, however, it may also be provided that the device is a separate fault-localizing device.

With regard to the device according to the invention, all details described above and below for the method according to the invention and vice versa apply accordingly, in particular the device according to the invention is configured to carry out the method according to the invention in any given embodiment or a combination of any given embodiments. In respect of the advantages of the device according to the invention, reference is also made to the advantages described in relation to the method according to the invention.

With the above and other objects in view there is also provided a system for determining the fault location of a fault on a line of an electrical energy supply network. According to the invention, two devices that are each configured as summarized above (the "device") are provided and are interconnected via a communication connection to exchange data. The devices of the system are configured to carry out the method as summarized above.

In terms of the system according to the invention, all details described above and below for the method according to the invention and the device according to the invention and vice versa apply accordingly. Also with regard to the advantages of the system according to the invention, reference is also made to the advantages described for the method according to the invention and the device according to the invention.

Other features which are considered as characteristic for the invention are set forth in the appended claims.

Although the invention is illustrated and described herein as embodied in a method, device and system for determining the fault location of a fault on a line of an electrical energy supply network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 12 a second view of a plurality of diagrams to explain the determination of a time difference through pattern comparison with cross-power spectrum and angle consideration;

FIG. 13 a third view of a plurality of diagrams to explain the determination of a time difference through pattern comparison with cross-correlation or quadratic target function; and FIG. 14 shows a schematic view of a flow diagram to explain an exemplary embodiment of a method for fault location according to the invention.

DETAILED DESCRIPTION OF THE INVENTION

Figure 1:
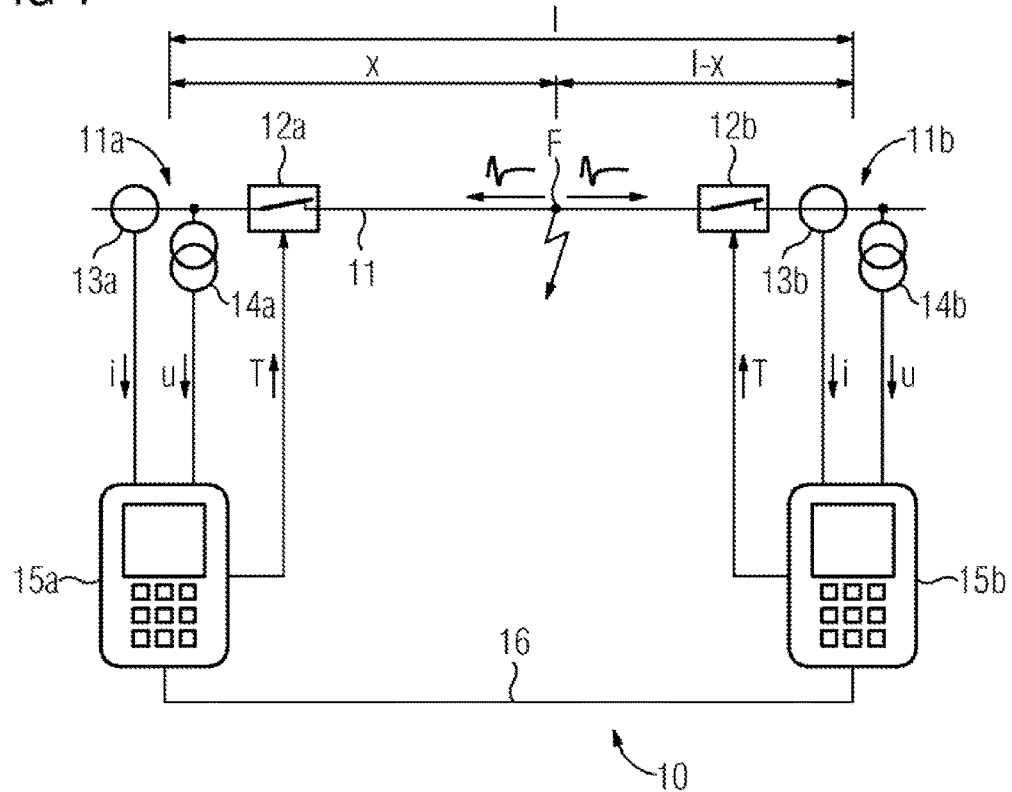
FIG. 1 shows a schematic view of a line of an energy supply network with a system for determining a fault location.

Referring now to the figures of the drawing in detail and first, particularly, to FIG. 1 thereof, there is shown a schematic view of a system 10 for determining a fault location in an electrical energy supply network. For this purpose, FIG. 1 shows a simplified representation of an electrical line 11 of the energy supply network. The line is assumed to have the length l. The line 11 may be a single-phase or multiphase line.

The line 11 is limited at its line ends 11a and 11b by power switches 12a, 12b and can be disconnected by the latter from the remaining energy supply network (not shown in detail in FIG. 1), particularly in the event of a fault. Measuring points at which current and voltage measured values are recorded with current transformers 13a, 13b and voltage transformers 14a, 14b shown in FIG. 1 merely by way of example are furthermore present at the line ends 11a, 11b. The current transformers 13a, 13b and the voltage transformers 14a, 14b may be conventional or unconventional transformers. Current measured values i and voltage measured values u, which may be analog or digitized values, are output by the transformers on the secondary side.

Devices 15a, 15b for determining a fault location are connected to the current transformers 13a, 13b and the voltage transformers 14a, 14b at the respective line ends 11a, 11b. The devices 15a, 15b record the current and voltage measured values and, if necessary, perform a digitization and/or a preprocessing. A timestamp is also allocated to the respective measured values, precisely indicating the time of their recording. For this purpose, the devices 15a, 15b have internal timers which are temporally synchronized with one another using conventional methods, e.g. GPS time pulses, IRIG-B, IEEE 1588. The measured values recorded at both line ends 11a, 11b are comparable with one another due to the timestamping.

The devices 15a, 15b may, for example, be electrical protection devices which, as well as a fault location function, perform other protection and monitoring functions also. For example, the protection devices may be distance protection devices, differential protection devices or overcurrent protection devices which monitor the operating state of the line 11 on the basis of the recorded current and voltage measured values and, in the event of a fault, transmit a shutdown signal T to their respective power switch 12a, 12b to cause the latter to open its switching contacts.

The devices 15a, 15b are configured, in the event of a fault on the line 11, to determine and output the fault location, i.e. the location on the line at which a fault (e.g. short circuit, ground fault) has occurred. To do this, they use the current and/or voltage measured values of their own line end and the respective other line end which have been recorded during the fault. For this purpose, the devices 15a, 15b are connected via a communication connection 16, which may be any given suitable wired or wireless communication connection. The devices 15a, 15b can exchange, inter alia, their current and/or voltage measured values via the communication connection 16 in order to determine the fault location.

The devices 15a, 15b carry out a fault location according to the travelling wave principle. This exploits the fact that, when a fault occurs, high-frequency transient signal components occur in the current and in the voltage and propagate roughly at the speed of light in both directions on the line 11. This is indicated by way of example in FIG. 1. For this purpose, it is assumed that a fault has occurred at a fault location F. As shown, the travelling waves propagate from the fault location F both in the direction of the first line end 11a and in the direction of the second line end 11b and can be measured there with the transformers and can be evaluated with the devices 15a, 15b in order to define the fault location. Seen from the first line end, the fault location F is located at a distance x, and, correspondingly from the perspective of the second line end, the fault location F is located at a distance l–x. As described in detail below, the devices evaluate the current and voltage measured values and indicate the fault location F, for example as a distance or percentage of the line length l.

The operator of the energy supply network can forward the determined fault location F to a maintenance team which can then visit the fault location and eliminate the cause of the fault. The most accurate possible determination of the fault location is required for this purpose. A procedure for precise fault location is described below.

A brief explanation of the principle of travelling wave fault location will first be given. For this purpose, a bilateral travelling wave fault location algorithm is explained, i.e. an algorithm which operates with measured values from both line ends 11a, 11b. A propagation model for travelling waves along the line 11 is used.

The "theory of long lines" is used to produce the algorithm concerned. This involves the model-based mapping of an electrical line in the form of "distributed parameters". This is shown by way of example in FIG. 2.

Figure 2:
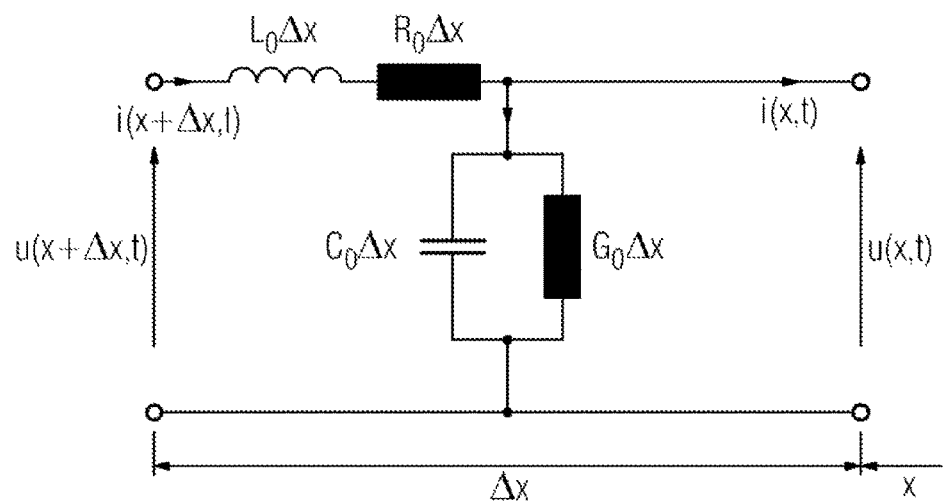
FIG. 2 shows a representation of the electrical parameters of a line section Δx to explain the definition of a fault location according to the travelling wave principle.

FIG. 2 shows that the network parameters such as the inductance per unit length $L_0$, capacitance per unit length $C_0$, resistance per line length $R_0$ and conductivity per unit length $G_0$ are distributed along the line. On the basis of this line model, using Kirchhoff's laws for the section $\Delta x$ of the line, the following equations are obtained for the voltage u and the current i:

$$u(x+\Delta x, t) = R_0 \Delta x \cdot i(x+\Delta x, t) + L_0 \Delta x \frac{\partial i(x+\Delta x, t)}{\partial t} + u(x, t) \quad (1)$$

$$i(x+\Delta x, t) + G_0 \Delta x \cdot u(x, t) + C_0 \Delta x \frac{\partial u(x, t)}{\partial t} + i(x, t) \quad (2)$$

Through mathematical transformations, equations (1) and (2) can be converted into the following form:

$$\frac{\partial u(x, t)}{\partial x} = R_0 \cdot i(x, t) + L_0 \frac{\partial i(x, t)}{\partial t} \quad (3)$$

$$\frac{\partial i(x, t)}{\partial x} = G_0 \cdot u(x, t) + C_0 \frac{\partial u(x, t)}{\partial t} \quad (4)$$

These equations (3) and (4) are partial differential equations of a homogeneous line and are normally referred to as "telegraph equations". They can be generalized to apply to any given conductors.

By considering equations (3) and (4) in the Laplace domain, assuming x as a parameter, many effects occurring in the line can be interpreted substantially more simply:

$$\frac{\partial u(x, s)}{\partial x} = R_0 \cdot i(x, s) + sL_0 \cdot i(x, s) \quad (5)$$

$$\frac{\partial i(x, s)}{\partial x} = G_0 \cdot u(x, s) + sC_0 \cdot u(x, s) \quad (6)$$

The derivation of equations (5) und (6) according to parameter x produces the following:

$$\frac{\partial^2 u(x, s)}{\partial x^2} = Z(s)Y(s) \cdot u(x, s) \quad (7)$$

$$\frac{\partial^2 i(x, s)}{\partial x^2} = Y(s)Z(s) \cdot i(x, s) \quad (8)$$

Equations (7) and (8) can be solved separately using the differential equation theory for voltage and current:

$$U(x) = e^{-\gamma(s)x} \cdot A_1 + e^{\gamma(s)x} \cdot A_2 \quad (9)$$

$$Z_c(s) \cdot I(x) = e^{-\gamma(s)x} \cdot A_1 - e^{\gamma(s)x} \cdot A_2 \quad (10)$$

In solving equations (9) und (10), it is possible to calculate the unknown parameters $A_1$ and $A_2$ from the initial conditions:

$$A_1 = \tfrac{1}{2}(U_1(s) + Z_c(s) \cdot I_1(s)) \quad (11)$$

$$A_2 = \tfrac{1}{2}(U_1(s) - Z_c(s) \cdot I_1(s)) \quad (12)$$

where $U_1$ and $I_1$ represent the initial conditions with x=0. In addition, equations (9) and (10) contain a wave impedance $Z_C$ and the propagation constant γ which can be calculated from the line parameters:

$$\gamma(s)^2 = Z(s)Y(s) \quad (13)$$

$$Z_c(s) = \gamma(s)^{-1} \cdot Z(s) \quad (14)$$

Here, Z represents the line impedance and Y the shunt admittance of a section of the line. The values are indicated in each case in relation to length.

The following forms are thus obtained for equations (9) and (10):

$$U(x,s) = \tfrac{1}{2}e^{-\gamma(s)x} \cdot (U_1(s) + Z_c(s) \cdot I_1(s)) + \tfrac{1}{2}e^{\gamma(s)x} \cdot (U_1(s) - Z_c(s) \cdot I_1(s)) \quad (15)$$

$$Z_c(s) \cdot I(x,s) = \tfrac{1}{2}e^{-\gamma(s)x} \cdot (U_1(s) + Z_c(s) \cdot I_1(s)) - \tfrac{1}{2}e^{\gamma(s)x} \cdot (U_1(s) - Z_c(s) \cdot I_1(s)) \quad (16)$$

Equations (15) and (16) represent a voltage-related and current-related propagation model for travelling waves along the line 11.

For the presently described travelling wave fault location, the fault voltage at the initially unknown fault location F is considered. The relation described in equation (15) is used here. Equation (15) is made up of two elements, one of which describes a forward-moving and the other a backward-moving voltage wave. The voltage wave at one line end 11a can be described mathematically in an almost identical manner from the line end 11b at the opposite end also:

$$U(l-x,s) = \tfrac{1}{2}e^{-\gamma(s)(l-x)} \cdot (U_1(s) + Z_c(s) \cdot I_1(s)) + \tfrac{1}{2}e^{\gamma(s)(l-x)} \cdot (U_1(s) - Z_c(s) \cdot I_1(s)) \quad (17)$$

In order to locate the fault, it is assumed that the voltage determined from both ends must be identical at the fault point:

$$U(x,s) = U(l-x,s) \tag{18}$$

This produces the following equation (19), wherein the index 1 represents the first line end and the index 2 represents the second line end:

$$e^{-\gamma(s)x}(U_1(s)+Z_c(s)\cdot I_1(s))-e^{\gamma(s)x}e^{-\gamma(s)l}(U_2(s)-Z_c(s)\cdot I_2(s))=e^{-\gamma(s)l}e^{\gamma(s)x}(U_2(s)+Z_c(s)\cdot I_2(s))-e^{\gamma(s)x}(U_1(s)-Z_c(s)\cdot I_1(s)) \tag{19}$$

If equation (19) is sorted according to an outgoing and a returning wave in relation to fault location x, the following equation (20) is obtained:

$$e^{-\gamma(s)x}[(U_1(s)+Z_c(s)\cdot I_1(s))-e^{-\gamma(s)l}(U_2(s)-Z_c(s)\cdot I_2(s))] = e^{\gamma(s)x}[e^{-\gamma(s)l}(U_2(s)+Z_c(s)\cdot I_2(s))-(U_1(s)-Z_c(s)\cdot I_1(s))] \tag{20}$$

In order to describe both sides of the equation in a similar manner, the element $\exp(\gamma(s)l)$ is placed in front of the bracket from the left side of the equation:

$$e^{\gamma(s)(l-x)}[e^{-\gamma(s)l}(U_1(s)+Z_c(s)\cdot I_1(s))-(U_2(s)-Z_c(s)\cdot I_2(s))] = e^{\gamma(s)x}[e^{-\gamma(s)l}(U_2(s)+Z_c(s)\cdot I_2(s))-(U_1(s)-Z_c(s)\cdot I_1(s))] \tag{21}$$

Equation (21) can then be represented in two forms similar to one another:

$$[e^{-\gamma(s)(l)}(U_1(s)+Z_c(s)\cdot I_1(s))-(U_2(s)-Z_c(s)\cdot I_2(s))] = e^{\gamma(s)(2x-l)}[e^{-\gamma(s)l}(U_2(s)+Z_c(s)\cdot I_2(s))-(U_1(s)-Z_c(s)\cdot I_1(s))] \tag{22a}$$

and $$e^{\gamma(s)(l-2x)}[e^{-\gamma(s)l}(U_1(s)+Z_c(s)\cdot I_1(s))-(U_2(s)-Z_c(s)\cdot I_2(s))] = [e^{-\gamma(s)l}(U_2(s)+Z_c(s)\cdot I_2(s))-(U_1(s)-Z_c(s)\cdot I_1(s))] \tag{22b}$$

If a wave pulse of one line end is taken as a reference, the wave pulse of the other line end is shifted by a time defined by the γ, since the relation (23) approximately applies:

$$e^{\gamma(s)(2x-l)} = e^{-s\frac{(l-2x)}{v}} \tag{23}$$

In equation (23), v means the speed of the travelling wave and l the length of the line; x denotes the fault location. It has been assumed here that the speed v of the travelling wave is to be regarded as constant in a broad frequency spectrum. Consideration of equation (23) produces an equation which is easily transferable into the time domain and with which the profiles of the travelling waves can be mapped:

$$e^{-s\frac{(2x-l)}{v}}[e^{-\gamma(s)(l)}(U_1(s)+Z_c(s)\cdot I_1(s))-(U_2(s)-Z_c(s)\cdot I_2(s))] = [e^{-\gamma(s)l}(U_2(s)+Z_c(s)\cdot I_2(s))-(U_1(s)-Z_c(s)\cdot I_1(s))] \tag{24}$$

If the profiles of the travelling waves in the two bracketed terms of equation (24) are denoted $S_1$ and $S_2$, the following is obtained:

$$e^{-s\frac{(2x-l)}{v}}S_2(s) = S_1(s) \tag{25}$$

The back transformation of this equation produces an easily interpretable result in the time domain:

$$S_2\left(t - \frac{2x-l}{v}\right) = S_2(t-\tau) = S_1(t) \tag{26}$$

It is evident here that a fault location can be carried out using the determination of the time difference τ between the wave profiles $S_1$ and $S_2$. In addition, the external shape of the two wave profiles $S_1$ and $S_2$ is identical. This characteristic is used below to define the fault location using a pattern recognition.

However, in order to be able to derive the wave profiles initially from the measured current and voltage measured values, it is essential to consider only the high-frequency signal components of the measured values. For this purpose, for example, a correspondingly designed filter can be used which removes the low-frequency components from the measurement signals.

Figure 3:
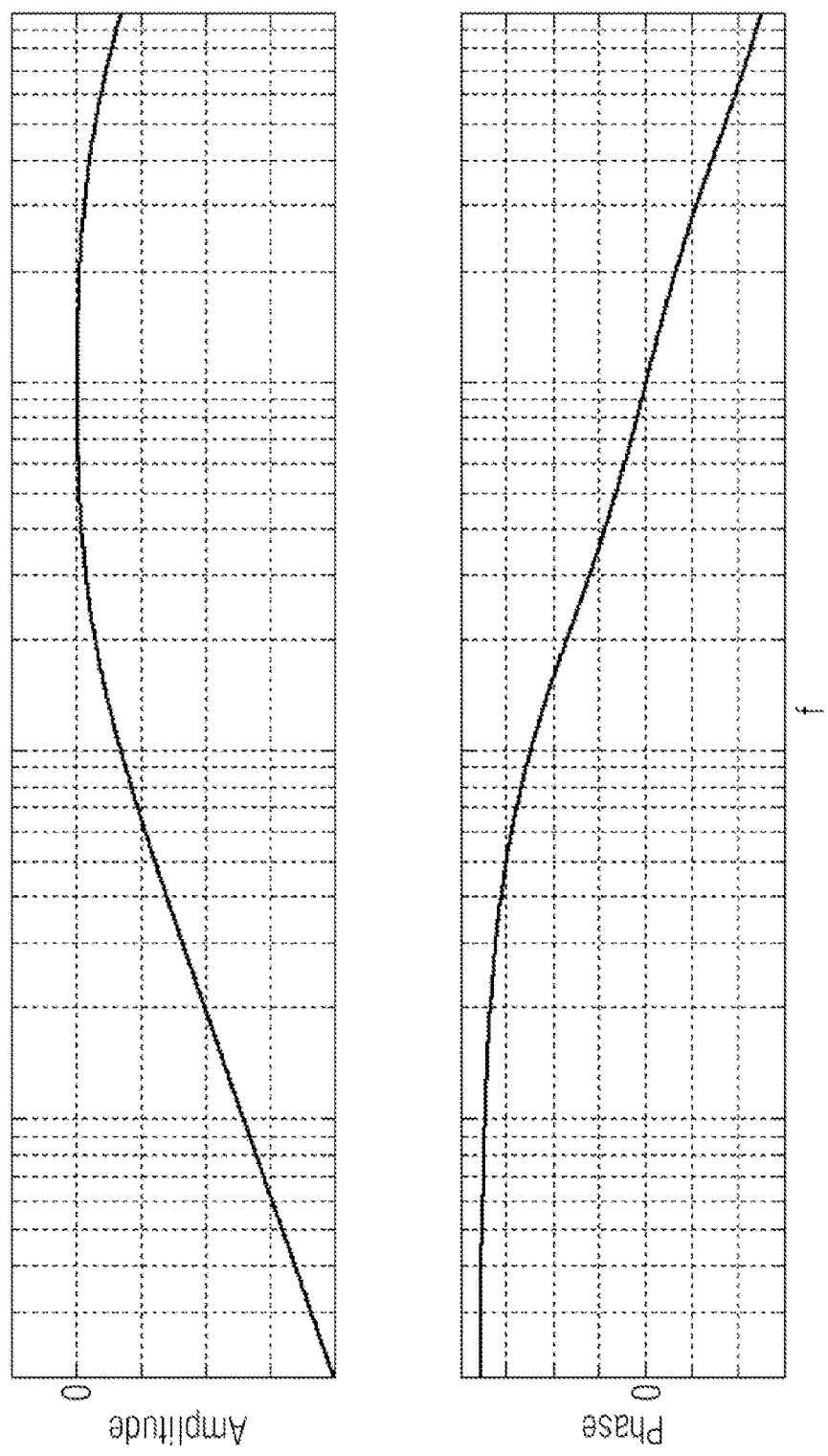
FIG. 3 shows an example of a transmission characteristic of a filter for generating filtered current and voltage values.

In this context, FIG. 3 shows the transmission function (amplitude and phase response) of an example of a filter by means of which the relevant frequencies are filtered from the characteristic of the current and voltage measured values for further analysis, wherein filtered current and voltage values are produced. An example of a passband of a suitable filter may be around 30 kHz to 400 kHz. In this range, conventional primary measuring transformers normally used in energy supply networks can transmit the signals with a quality sufficient for the fault location.

Figure 4:
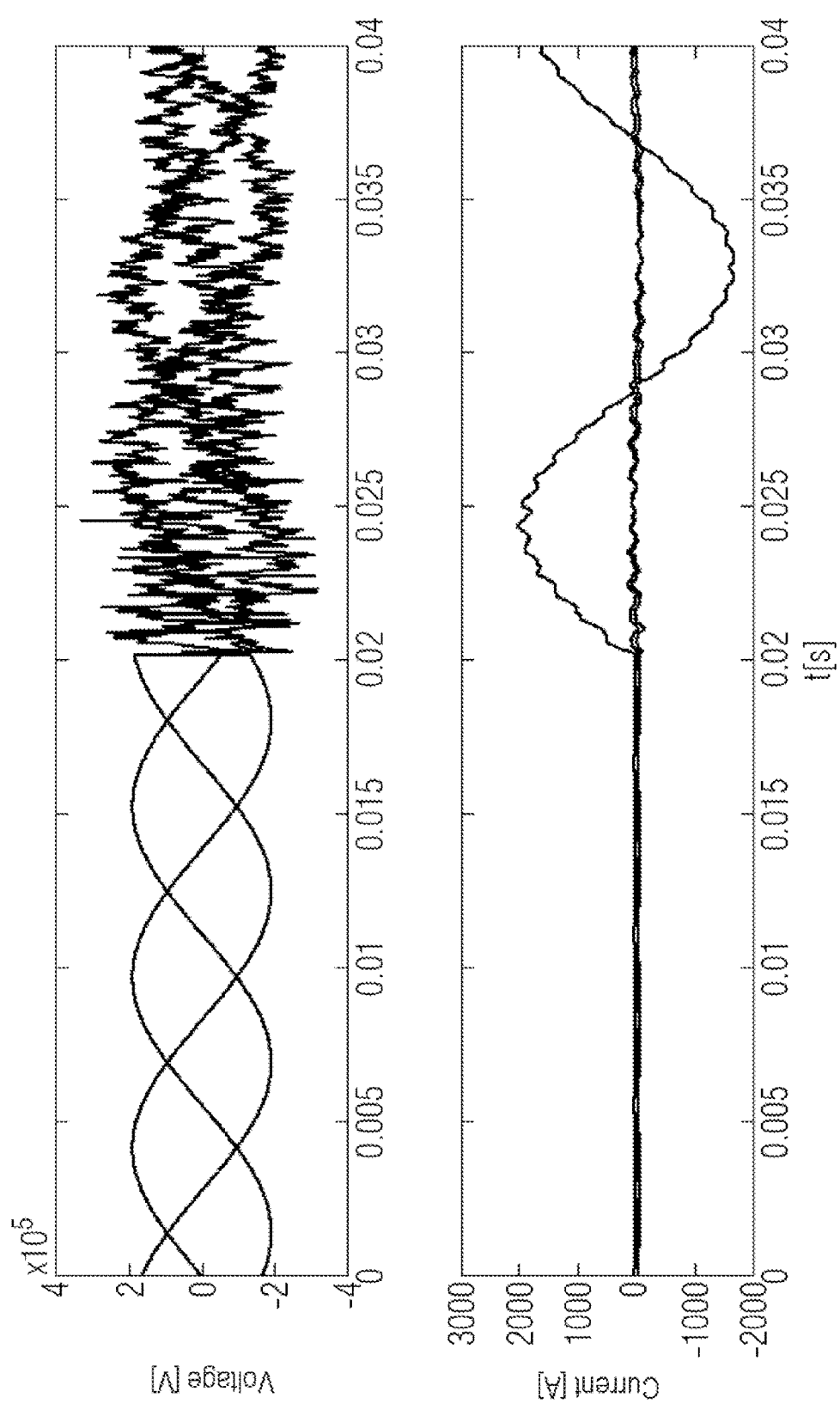
FIG. 4 shows examples of characteristics of current and voltage measured values.
Figure 5:
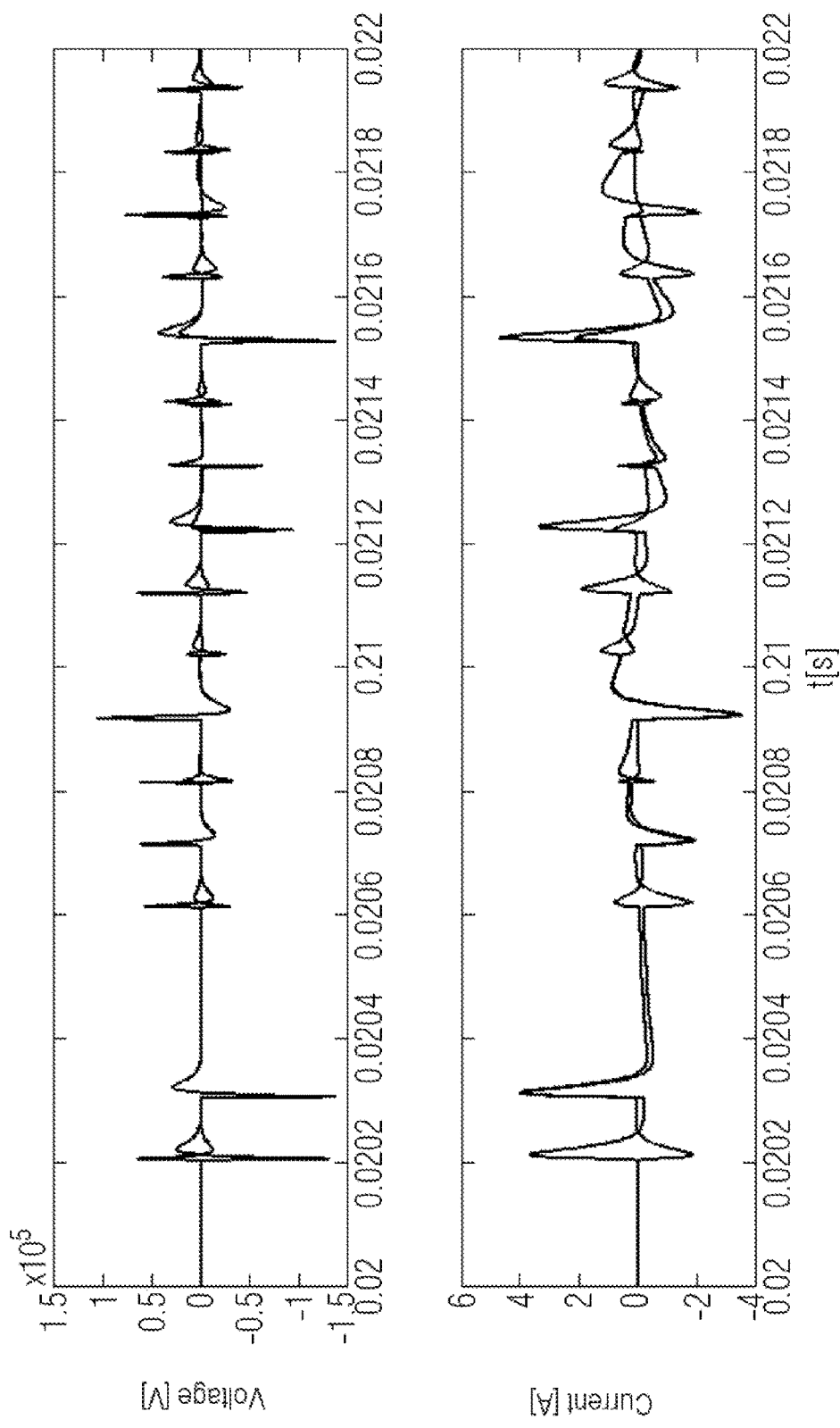
FIG. 5 shows examples of characteristics of filtered current and voltage values.

FIGS. 4 and 5 show by way of example how the filter impacts on the recorded current and voltage measured values. FIG. 4 shows an example of a characteristic of current and voltage measured values at a line end of a three-phase high-voltage line during a single-pole fault in phase A. The single-pole fault causes a rise in the current in the fault-affected phase A, whereas the voltage drops in phase A. Following the onset of the fault, the current and voltage signals contain high-frequency transients which are to be evaluated for the fault location.

The high-frequency transient components of the current and voltage measured values can be filtered out using a filter (for example a bandpass filter as described in connection with FIG. 2). This produces filtered current and voltage values as shown by way of example in FIG. 5. In considering the filtered current and voltage values, it should be noted that phases B and C that are unaffected by a fault have corresponding high-frequency patterns.

The lines in energy supply networks normally comprise at least three phase conductors. It is thus necessary to present the above equations indicated for a single-conductor system in the form of a matrix. An equation system of this type can be simplified by means of a modal or eigenvalue transformation. This enables the individual equations of the resulting equation system to be decoupled from one another and thus to be considered independently from one another. In addition, this transformation enables the equations already obtained to be considered in transformed components.

By way of example, a simple symmetrical line having the following parameters for a rated frequency of 60 Hz will be considered below:

$$Z = \begin{bmatrix} 0.187+j0.858 & 0.098+j0.3705 & 0.098+j0.3705 \\ 0.098+j0.3705 & 0.187+j0.858 & 0.098+j0.3705 \\ 0.098+j0.3705 & 0.098+j0.3705 & 0.187+j0.858 \end{bmatrix} \Omega \tag{27}$$

-continued $$Y = 1e-5 \begin{bmatrix} j0.3 & -j0.036 & -j0.036 \\ -j0.036 & j0.3 & -j0.036 \\ -j0.036 & -j0.036 & j0.3 \end{bmatrix} S \quad (28)$$

Here, Z represents the line impedance and Y the line admittance. The Clark transformation is used by way of example as the modal transformation for decoupling. This has a transformation matrix T as follows; this produces $\alpha$, $\beta$ and 0 components:

$$T = \frac{2}{3} \begin{bmatrix} 1 & -0.5 & -0.5 \\ 0 & \frac{\sqrt{3}}{2} & -\frac{\sqrt{3}}{2} \\ 0.5 & 0.5 & 0.5 \end{bmatrix} \quad (29)$$

The aforementioned matrices (27) and (28) can be transformed with the Clark transformation as follows:

$$z_{\alpha\beta 0} = TZT^{-1} = \begin{bmatrix} 0.0894 + j0.487 & 0 & 0 \\ 0 & 0.0894 + j0.487 & 0 \\ 0 & 0 & 0.383 + j1.599 \end{bmatrix} \Omega \quad (30)$$

$$i) \; Y_{\alpha\beta 0} = TYT^{-1} = 1e^{-5} \begin{bmatrix} j0.336 & 0 & 0 \\ 0 & j0.336 & 0 \\ 0 & 0 & j0.229 \end{bmatrix} S \quad (31)$$

In conjunction with equations (13) and (14), this produces the three propagation constants (equation (32)) and wave impedances (equation (33)) which are to be considered:

$$\gamma_{\alpha\beta 0} = \begin{bmatrix} 0.0001 + j0.00128 & 0 & 0 \\ 0 & 0.0001 + j0.00128 & 0 \\ 0 & 0 & 0.0002 + j0.0019 \end{bmatrix} \quad (32)$$

$$Z_{C\alpha\beta 0} = 1e+2 \begin{bmatrix} 3.821 - j0.3475 & 0 & 0 \\ 0 & 3.821 - j0.3475 & 0 \\ 0 & 0 & 8.411 - j0.994 \end{bmatrix} \Omega \quad (33)$$

Figure 6:
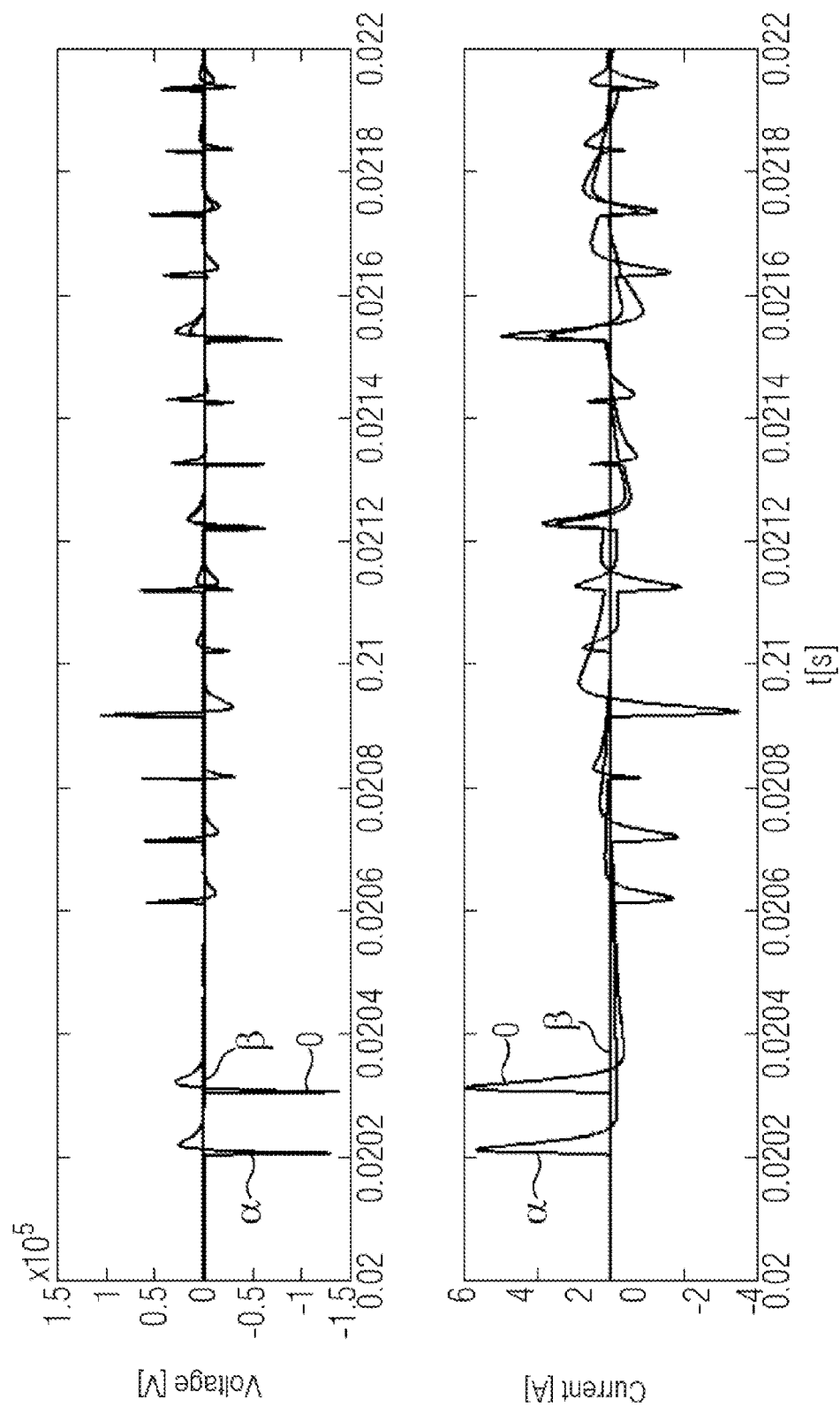
FIG. 6 shows examples of characteristics of transformed current and voltage values generated from the filtered current and voltage values.

Through the analysis of the propagation constant $\gamma$, it is possible to infer which of the modal components has the highest speed, this being preferably used for the further analysis. In addition, the component which occurs to a sufficient extent in the signal must be evaluated. This depends heavily on the fault type. FIG. 6 shows the transformed current and voltage values produced from the filtered current and voltage values through transformation. These represent the actual travelling waves which are used for the fault location.

FIG. 6 shows that, in the example of the single-pole fault in Phase A, the $\beta$-component does not occur. It is furthermore evident that the 0-component is substantially slower than the $\alpha$-component.

Figure 7:
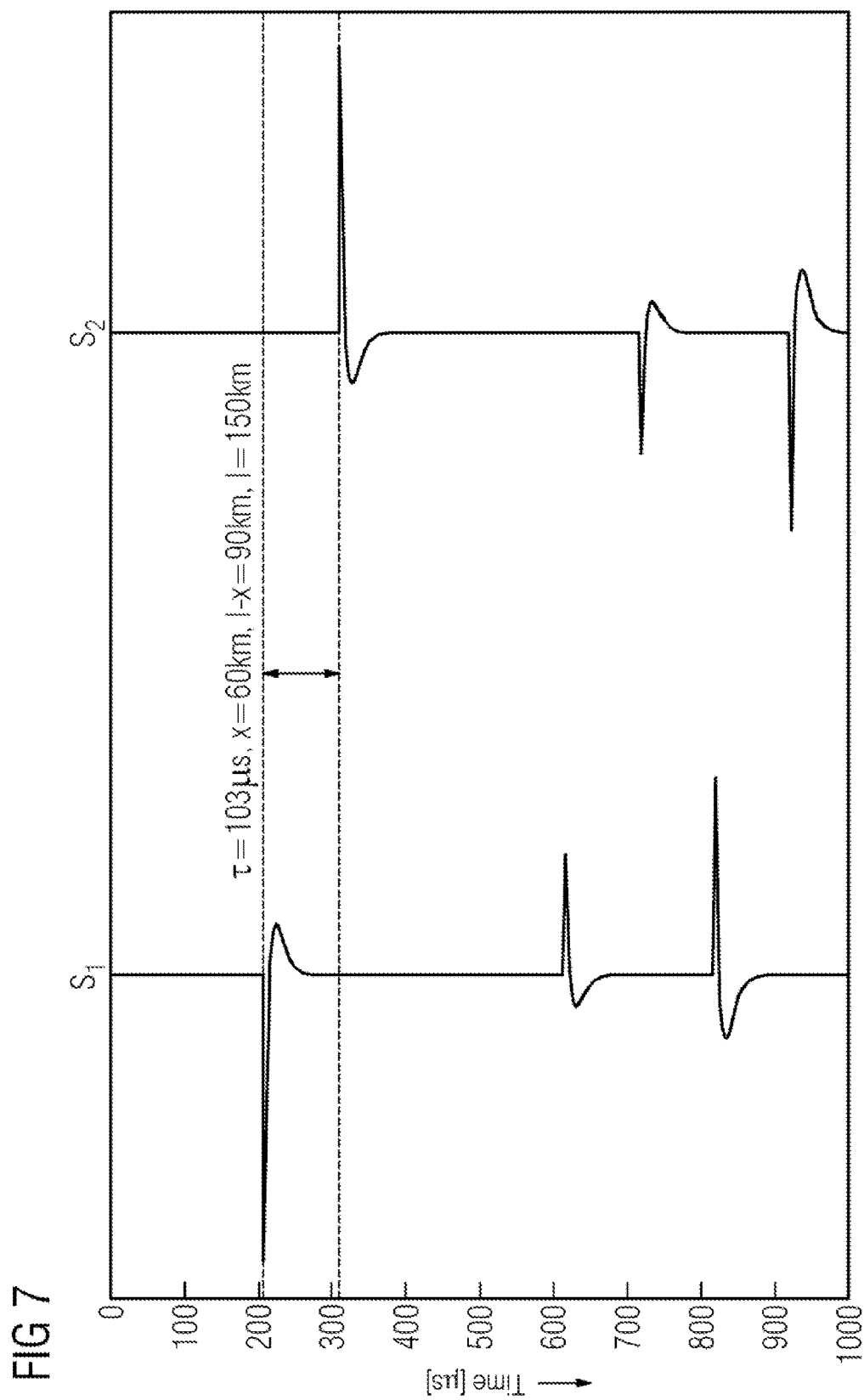
FIG. 7 a first example of a diagram with profiles of travelling waves to explain a fault location definition.

As already mentioned above, the external shape of the wave profiles $S_1$ and $S_2$ is identical and is furthermore not dependent on the fault location. The time difference $\tau$ is therefore an unambiguous criterion for indicating the fault location. For this reason, the desired parameter here is the time difference $\tau$. This is shown in FIG. 7. In FIG. 7, the wave profiles $S_1$ and $S_2$ are plotted along a time axis. The two wave profiles can be temporally allocated to one another through the timestamping of the current and voltage measured values with synchronized timers of the devices 15a, 15b (cf. FIG. 1). Since the time basis is predefined, the time difference $\tau$ can be determined through the shift of one wave profile toward the other. The best overlap of the two wave profiles in the function of the shift indicates the correct time difference and therefore the fault location, since the following is obtained from equation (26) for the relation between the fault location x and the time difference $\tau$:

$$x = \frac{(v \cdot \tau - l)}{2} \quad (34)$$

In the example shown in FIG. 7, a fault location of x=60 km from the first line end with a line length of 150 km is obtained from the determined time difference $\tau$=103 μs.

Since the two wave profiles occur only temporally shifted in relation to one another, but otherwise have the same external shape, a pattern recognition can be used to determine the best overlap of the wave profiles and therefore the time difference $\tau$. The specific procedure is set out in more detail later.

Closer examination of equations (24) and (25) reveals that a relatively extensive data exchange of synchronously stamped measured values between the devices 15a and 15b is required in order to calculate the wave profiles $S_1$ and $S_2$. In the case of an offline fault location, this fact is not significant, since the complete recordings of traveling waves can be made available and can be evaluated for this purpose. To do this, the measured values can be retrieved from the devices over more or less any length of time and can be evaluated with a separate data processing device. However, in the case of the online fault location by the devices 15a and 15b themselves, problems may occur if the communication connection 16 between the devices 15a, 15b does not have sufficient bandwidth.

Figure 8:
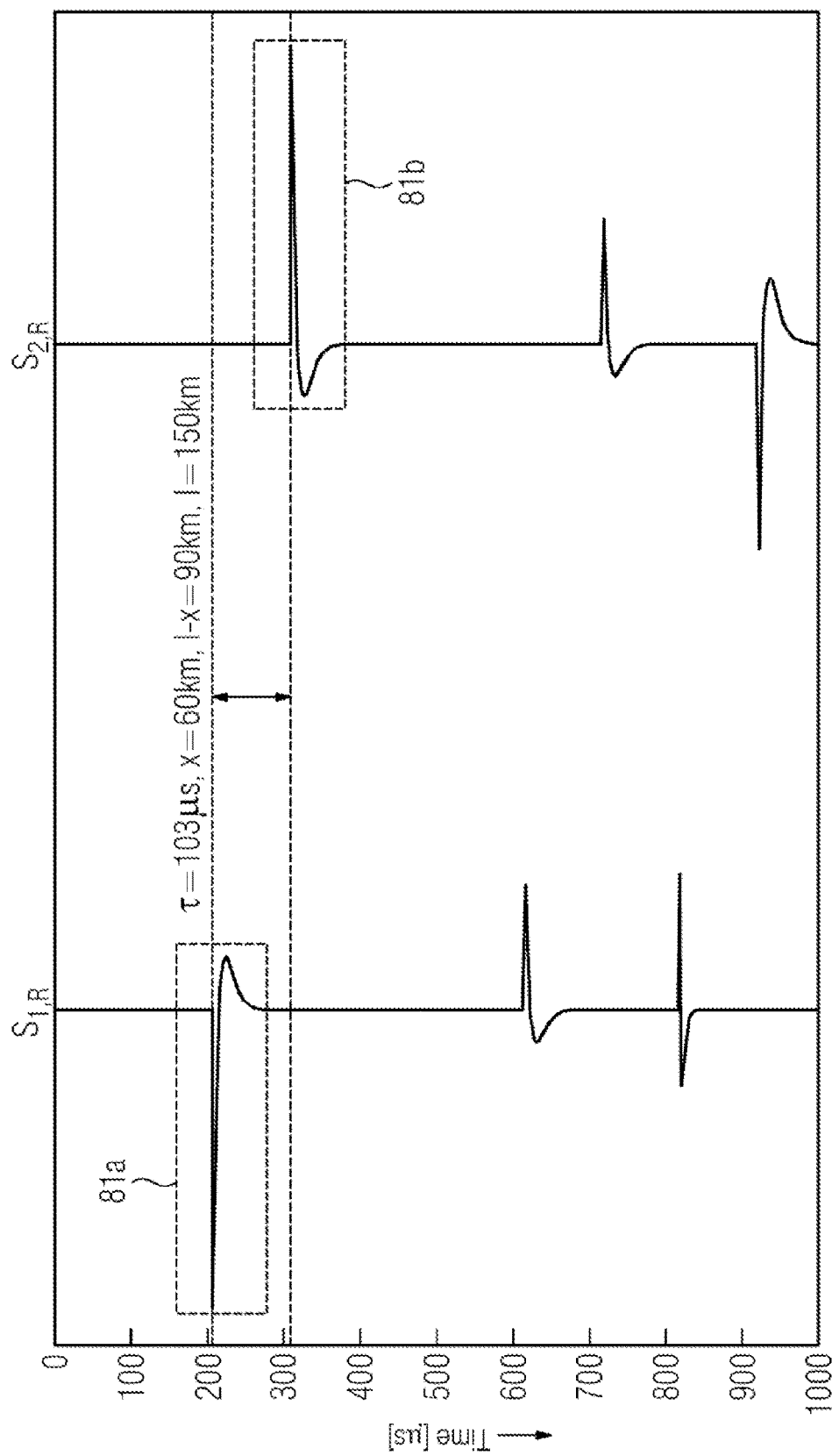
FIG. 8 a second example of a diagram with profiles of travelling waves to explain a fault location definition, wherein only the first pulse of the travelling waves is considered.

It would be advantageous for this purpose if the data volume to be transmitted for the fault location could be reduced. To do this, it is proposed to transmit only the first pulse of the respective traveling wave to the opposite end. The first pulse of the profile $S_1$ and $S_2$ of a traveling wave furthermore contains no information relating to the behavior of the traveling wave from the opposite end, since this information arrives at the local line end only after a reflection at the opposite end and after the subsequent transit time over the entire line ($\exp(-\gamma(s) \cdot l)$). For this reason, equations (24) and (25) presented above can be reduced as follows:

$$e^{-s\frac{(2x-l)}{v}}[-(U_2(s) - Z_c(s) \cdot I_2(s))] = [-(U_1(s) - Z_c(s) \cdot I_1(s))] \quad (35)$$

and $$e^{-s\frac{(2x-l)}{v}} S_{2,R}(s) = S_{1,R}(s) \qquad (36)$$

wherein $S_{1,R}$ and $S_{2,R}$ represent the profiles of the traveling waves reduced accordingly to the first pulse. This embodiment is shown in FIG. 8. The characteristics of the wave profiles $S_{1,R}$ and $S_{2,R}$ are defined here in each case according to equation (35) and (36). The first wave pulse used to evaluate the wave profiles $S_{1,R}$ and $S_{2,R}$ for the fault location is highlighted in FIG. 8 by borders 81a and 81b. As is evident in comparison with FIG. 7, the characteristic of the respective first wave pulse is not influenced by this simplification, since, as mentioned, no overlay with reflections from the respective other line end has yet taken place. Differences in the wave profiles $S_1$ and $S_{1,R}$ and $S_2$ and $S_{2,R}$ are thus located only in the further characteristic of the respective profiles. The definition of the time difference $\tau$ carried out by means of a pattern recognition also delivers the same value as in the evaluation of the complete profiles $S_1$ and $S_2$, so that the fault location can be carried out with the same accuracy with the reduced profiles $S_{1,R}$ and $S_{2,R}$ also.

The examination of the reduced equations (35) and (36) furthermore reveals that the wave profiles $S_{1,R}$ and $S_{2,R}$ are formed from a linear combination of voltages and currents. Since the wave impedance $Z_C$ can be assumed to be constant in the frequency range concerned, the characteristics of the wave profiles can be considered more or less separately from one another in terms of currents and voltages. As a result, on the one hand, the data volume to be transmitted can be decreased and, on the other hand, the complexity of the pattern comparison to determine the time difference $\tau$ can be reduced.

The following therefore applies to an examination based solely on currents:

$$e^{-s\frac{(2x-l)}{v}} [I_2(s)] \cong [(I_1(s))] \qquad (37)$$

and $$e^{-s\frac{(2x-l)}{v}} S^I_{2,R}(s) \cong S^I_{1,R}(s) \qquad (38)$$

Here, $S^I_{1,R}$ and $S^I_{2,R}$ represent the current-based profiles of the travelling waves at the respective line end, reduced to the first wave pulse.

The same applies accordingly to an examination based solely on voltages:

$$e^{-s\frac{(2x-l)}{v}} [-(U_2(s))] \cong [-(U_1(s))] \qquad (39)$$

and $$e^{-s\frac{(2x-l)}{v}} S^V_{2,R}(s) \cong S^V_{1,R}(s) \qquad (40)$$

Here, $S^V_{1,R}$ and $S^V_{2,R}$ represent the voltage-based profiles of the travelling waves at the respective line end, reduced to the first wave pulse.

Figure 9:
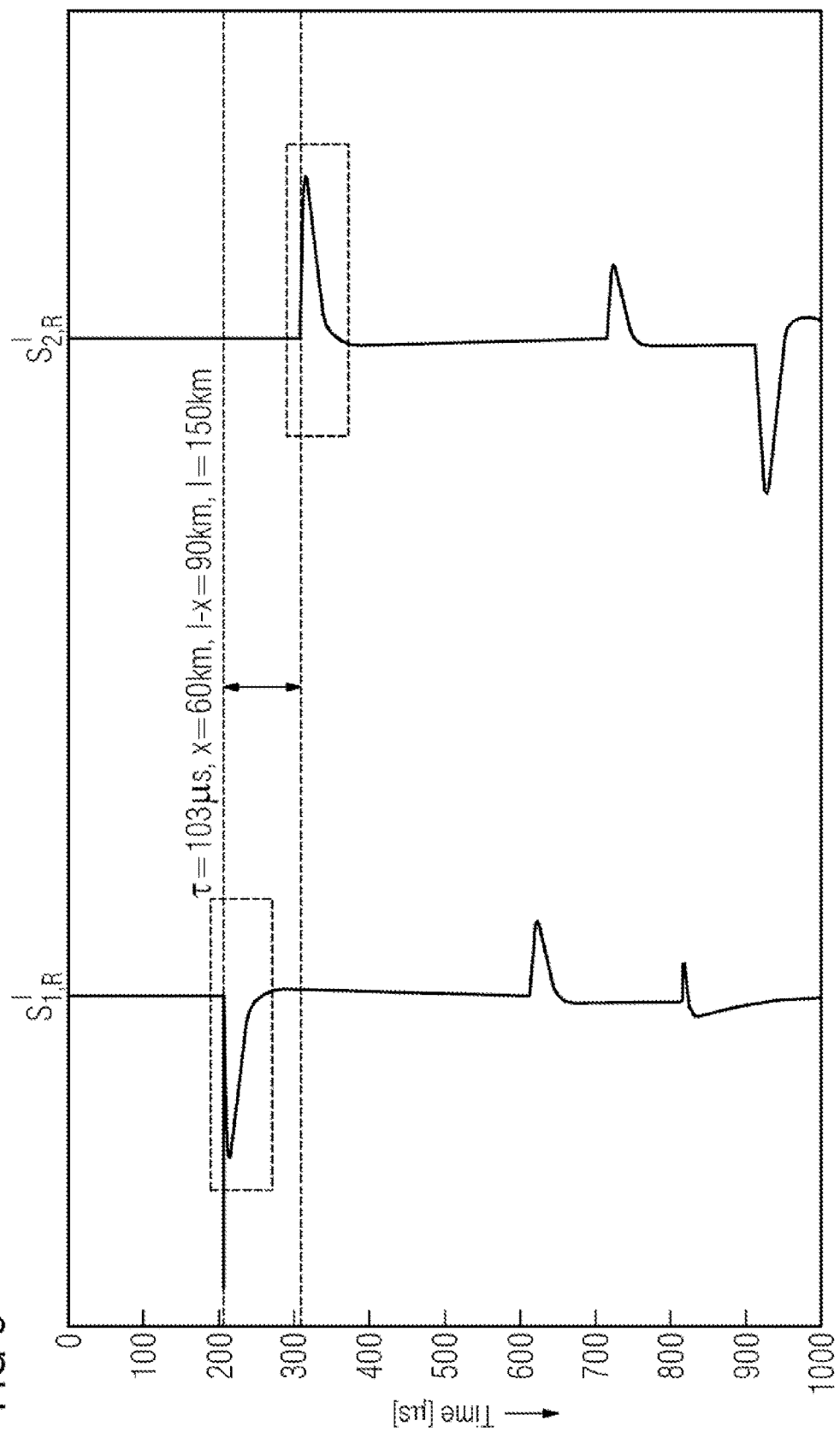
FIG. 9 a third example of a diagram with profiles of travelling waves to explain a fault location definition, wherein only the first pulse of the travelling waves is considered and the profiles have been formed using current measured values.
Figure 10:
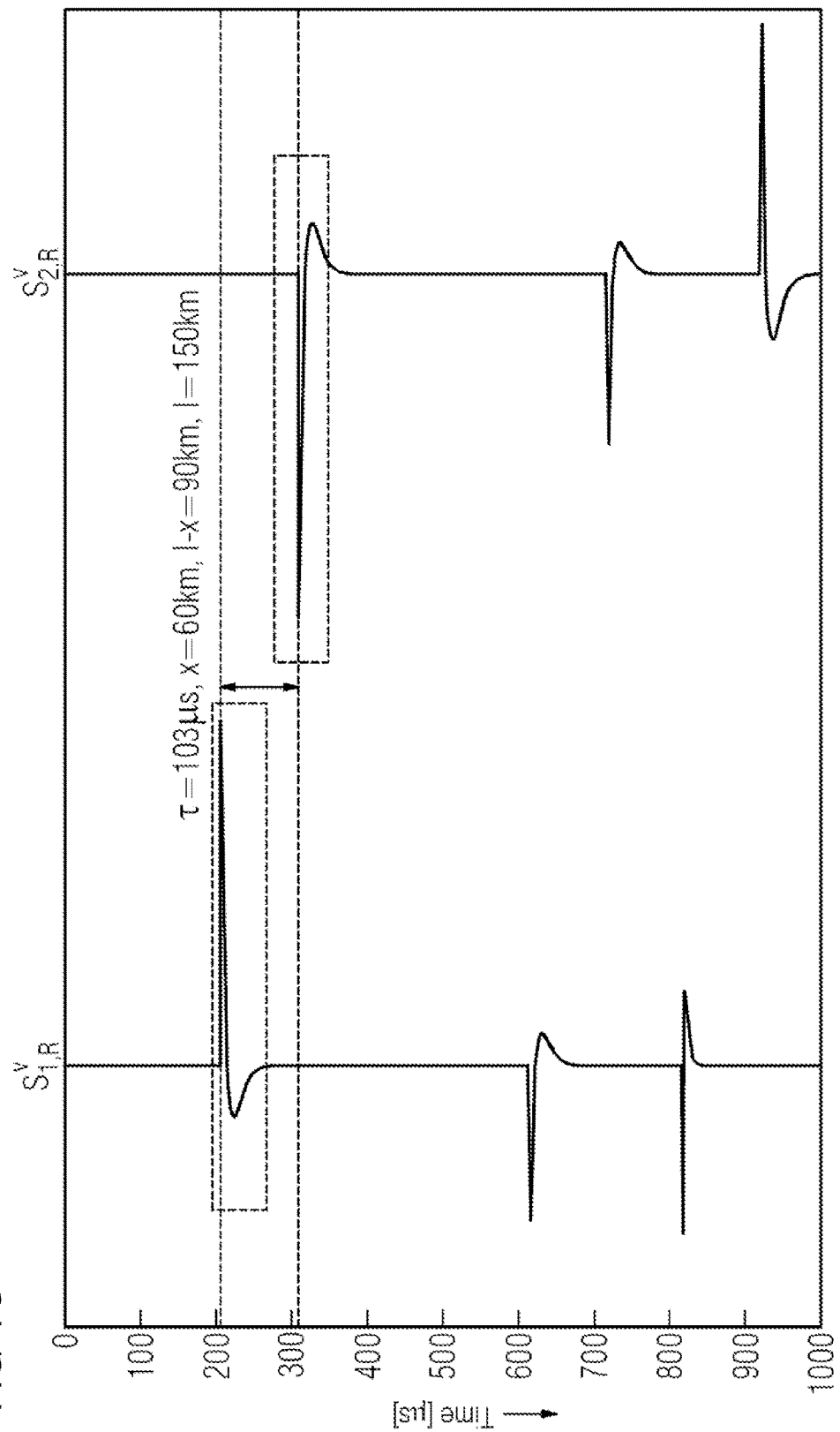
FIG. 10 a fourth example of a diagram with profiles of travelling waves to explain a fault location definition, wherein only the first pulse of the travelling waves is considered and the profiles have been formed using voltage measured values.

The characteristics of the corresponding wave profiles $S^I_{1,R}$ and $S^I_{2,R}$ and $S^V_{1,R}$ and $S^V_{2,R}$ are shown in FIGS. 9 and 10. The first wave pulses used for the evaluation are highlighted in FIG. 8 by framing. A further simplification of the profile shapes is evident in comparison with FIG. 8. The evaluation in terms of the time difference $\tau$ nevertheless provides an acceptable accuracy for the fault location.

It is described below how the time difference $\tau$ and therefore the fault location x can be determined using a pattern recognition performed in respect of the wave profiles at the line ends. All described methods are initially based on the aforementioned realization that the wave profiles at both line ends differ from one another in terms of a temporal shift, but the external shape of both wave profiles is identical. In order to define the correct time difference $\tau$, the optimum overlap of the external shapes of the wave profiles must first be found through shifting on the time axis. The value of the temporal shift carried out then corresponds to the desired time difference $\tau$.

The time difference $\tau$ resulting from the best overlap of the wave profiles can be determined in different suitable ways. Some possible procedures will be explained below by way of example. In principle, the pattern recognition can be carried out in respect of both the complete wave profiles $S_1$, $S_2$ and in respect of the reduced wave profiles $S_{1,R}$, $S_{2,R}$ and $S^I_{1,R}$, $S^I_{2,R}$ and $S^V_{1,R}$, $S^V_{2,R}$ described above. The question as to which wave profile is to be used for the evaluation must be answered following a consideration of the bandwidth available for the data transmission and the required location accuracy. The types of the wave profiles used for the evaluation may be selectable, for example, as parameters in the devices 15a, 15b, so that the suitable evaluation basis can be selected by the operator of the energy supply network for the respective individual case.

The time difference $\tau$ can be defined, for example by forming a cross-correlation between the wave profiles $S_1$, $S_2$ and $S_{1,R}$, $S_{2,R}$ and $S^I_{1,R}$, $S^I_{2,R}$ and $S^V_{1,R}$, $S^V_{2,R}$. The following equation (using the example of $S_1$ and $S_2$) can be used for this purpose:

$$K_{S_1 S_2}(\tau) = \frac{1}{T_F} \int_{t_0}^{t_0+T_F} S_1(t) \cdot S_s(t+\tau) dt \qquad (41)$$

Figure 11:
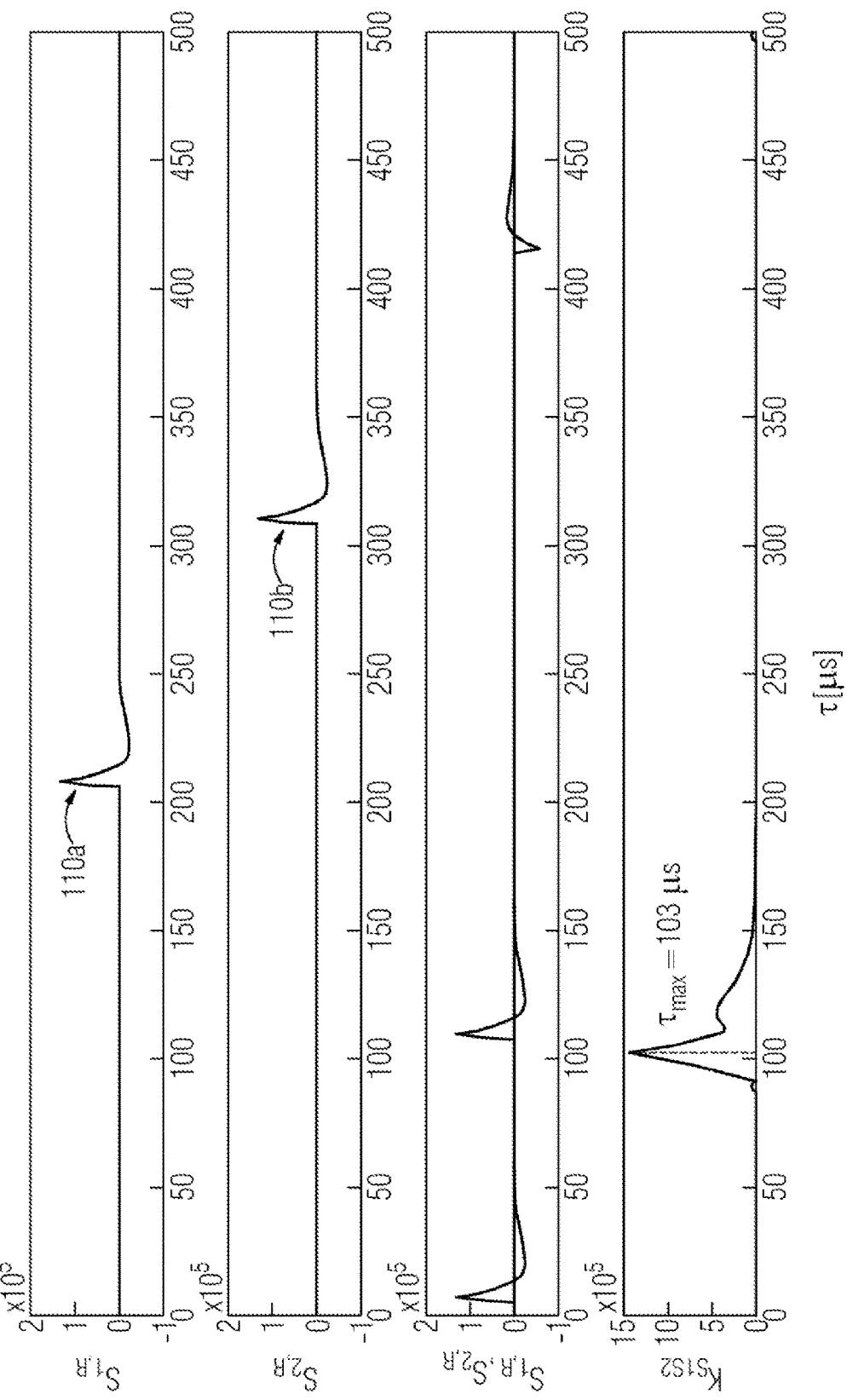
FIG. 11 a first view of a plurality of diagrams to explain the determination of a time difference through pattern comparison with cross-correlation.

Here, $T_F$ represents the duration of a measurement window. The maximum of this curve indicates the correct time difference $\tau$ and therefore, according to (34), the fault location x. This procedure is indicated by way of example in FIG. 11. FIG. 11 shows four diagrams for this purpose, wherein the two upper diagrams indicate the characteristics of the wave profiles $S_{1,R}$ and $S_{2,R}$ reduced to the first wave pulse. The temporal shift of the wave pulses 110a and 110b is evident. Both wave profiles are shown jointly in the third diagram, wherein the time $t_0=0$ has been positioned at the start of the first wave profile. Finally, the characteristic of the cross-correlation $K_{S_1S_2}$ according to equation (41) is shown in the fourth diagram. The maximum of the curve indicates the time shift $\tau$ of the two wave profiles $S_{1,R}$ and $S_{2,R}$ and can be used to define the fault location.

A corresponding search for the correct time difference $\tau$ can also be carried out in the frequency domain. This approach can be advantageous, as it enables a restriction to the essential frequency components. The wave profiles considered are then:

$\underline{S}_1(f)=\text{FFT}\{S_1(t)\}$, $\underline{S}_2(f)=\text{FFT}\{S_2(t)\}$ Through the formation of a cross-power spectrum $$K_{S_1 S_2}(f) = \underline{S}_1(f) \cdot \underline{S}^*_2(f) \qquad (42)$$

(the asterisk * indicates the complex-conjugate here) the correct time difference τ can be found by searching for the maximum of the following function:

$$K_{S_1 S_2}(f,\tau) = \underline{S}_1(f) \cdot (\underline{S}_2(f) e^{i2\pi f \tau}) \quad (43)$$

According to equation (43), the maximum of the curve should theoretically show the same values for the time difference τ for each frequency. In practice, however, it is advisable to take a cumulated sum of all effective frequencies for the time difference τ and use this to search for the maximum:

$$\tau = \max(\Sigma K_{S_1 S_2}(f,\tau)) \quad (44a)$$

Furthermore, alternatively or additionally, the angle of the cross-power spectrum can also be considered:

$$\tau = \text{angle}(\Sigma K_{S_1 S_2}(f,\tau)) \quad (44b)$$

A zero crossing of the angle indicates a maximum of the curve of the cross-power spectrum and therefore the correct time difference τ.

For this purpose, the characteristic of the curve of the cross-power spectrum is shown in FIG. 12 in the upper diagram, and the characteristic of the angle of the cross-power spectrum is shown in the lower diagram. It is evident that the characteristic of the angle has a zero crossing at the position of the maximum of the cross-power spectrum. The angle criterion can thus be used, for example, in addition to the cross-power spectrum in order to define the maximum of the latter more accurately.

Finally, the time difference τ can also be defined by means of a quadratic target function, wherein a search for the maximum is required in this case:

$$Q_{S_1 S_2}(\tau) = \int_{t_0}^{t_0+T_F} [S_1(t) - S_2(t+\tau)]^2 dt \quad (45)$$

The characteristic of the quadratic target function according to equation (45) is shown by way of example in FIG. 13 in comparison with the cross-correlation according to equation (41). It is evident that the maximum of the quadratic target function is located in the lower diagram at the same position as the maximum of the cross-correlation in the upper diagram.

Alternatively, the quadratic target function can also be solved in the frequency domain:

$$Q_{S_1 S_2}(f,\tau) = (\underline{S}_1(f) - (\underline{S}_2(f) e^{i2\pi f \tau})) \cdot (\underline{S}_1(f) - (\underline{S}_2(f) e^{i2\pi f \tau}))^* \quad (46)$$

In the case of a lossless or at least low-loss line, the external shapes of the signals $S_1$, $S_2$ and $S_{1,R}$, $S_{2,R}$ and $S'_{1,R}$, $S'_{2,R}$ and $S^V_{1,R}$ will in fact hardly differ from one another. The pattern recognition methods proposed here can thus be regarded as totally adequate for the fault location. However, if a line is considered in which the losses can no longer be ignored, a frequency-dependent correction can be introduced which improves the shape of the curves and therefore contributes to the more accurate location of the fault (below by way of example for $\underline{S}_2$):

$$S_{2,korr}(f) = S_2(f) \cdot e^{Re[\gamma(f)] \cdot \frac{(t \cdot v_f - l)}{2}} \quad (47)$$

It has been assumed here that the propagation time in the frequency spectrum to be considered remains constant. If this is not the case, a frequency-dependent correction can also be additionally applied to the propagation time of the travelling wave.

FIG. 14 finally shows a schematic flow diagram of an example embodiment of a method for determining a fault location. The method steps above the dotted line take place in the device 15a at the first line end 11a, while those below the dotted line take place in the device 15b at the second line end 11b (cf. FIG. 1).

The local currents and voltages are measured in each case with the devices 15a, 15b at both line ends in steps 120a and 120b and corresponding current and voltage measured values are produced. These measured values are present as sampling values of the current and voltage signals of the line 11. An example of the recorded current and voltage measured values is shown in FIG. 4.

So that only the high-frequency transient components (travelling waves) of the respective current and voltage measured values are recorded, a filtering (e.g. by a bandpass filter) takes place in each case in steps 121a and 121b. Through the selection of the cut-off frequencies, e.g. of the bandpass filter, the method can be adapted to the characteristics of the transformers 13a, 13b and 14a, 14b. If these transformers provide only a medium bandwidth, e.g. up to 10 kHz only, the filters must limit the bandwidth of the signals to the bandwidth of the transformers. Depending on the phase error of the transformers used, a slightly lower measurement accuracy can then be expected. If the transformers can provide a higher bandwidth, e.g. up to 500 kHz, the filters should be dimensioned accordingly.

Filtered current and voltage values are generated in steps 121a, 121b, as shown by way of example in FIG. 5. An example of a transmission characteristic of a suitable filter is shown in FIG. 3.

It furthermore proves to be advantageous if the filter characteristic of the filter used to filter the current and voltage measured values dampens the frequency components in which the measuring transformers 13 and 14 have measurement errors.

In steps 122a and 122b, the respective travelling waves are treated in each case by means of a transformation (e.g. Clarke transformation), e.g. in order to decouple the phase-related components. Transformed current and voltage values are generated, as shown by way of example in FIG. 6.

In order to start the fault location method or to position the measurement window correctly for the evaluation only if required, i.e. in the event of a fault, a transient jump, which is used e.g. as a trigger for the measurement window positioning, can furthermore be determined in each case for each side in steps 123a and 123b. The length of the measurement window should preferably be at least twice the propagation time of the travelling wave in the selected modal component. The jump detection can take place in relation to the transformed or filtered current and voltage values or in relation to the original current and voltage measured values.

If the following evaluation is to take place in the frequency domain, a transfer of the transformed current and voltage values into the frequency domain takes place in steps 124a and 124b. This is preferably performed by means of Fast Fourier Transform (FFT) or Discrete Fourier Transform (DFT).

Furthermore, in the case of lossy lines, a frequency-dependent correction of the travelling wave profiles (cf. equation (47)) can take place. This is provided in steps 126a and 126b.

As indicated by the arrows between the blocks of steps 124a and 124b, the resulting values are exchanged in the frequency domain between the devices 15a and 15b (cf. FIG. 1). This is performed via the communication connection 16.

With their own values and the values from the respective other line end, the devices 15a and 15b then perform a fault location search by means of pattern recognition as described above in steps 125a and 125b. The target function can be processed, for example, in steps 125a and 125b according to equations (43) or (46). If an evaluation takes place in the time domain, the data can be exchanged in the time domain instead and can be evaluated according to equations (41) and (45). As described above, the best possible overlap of the wave profiles of the travelling waves at both line ends is sought. This results in a time difference τ which indicates the fault location x according to equation (34).

The determined fault location is then output in step 127. According to FIG. 14, this takes place in a joint output step. Instead, a separate output can also be performed by each of the two devices 15a and 15b.

The devices 15a and 15b normally have a processing device in which steps 120a/b to 127 are carried out. This may be e.g. a microprocessor which accesses corresponding device software which is located in a memory of the respective device. Alternatively, it may also be a processing module with hardware-defined programming, e.g. an ASIC or FPGA.

In sum, FIGS. 1 and 14 have shown a system for determining a fault location in which the fault location is determined with two devices 15a and 15b which are located in each case at one line end 11a or 11b. Instead, a central device can also be provided to which the current and voltage measured values from the line ends are fed.

Although the invention has been illustrated and described in detail above by means of preferred example embodiments, the invention is not limited by the disclosed examples and other variations may be derived herefrom by the person skilled in the art without exceeding the protective scope of the patent claims set out below.

The invention claimed is:

1. A method for determining a fault location of a fault on a line of an electrical energy supply network, the method comprising:
measuring first values selected from a group consisting of current values and voltage values at a first line end of the line and providing the first values with a timestamp;
measuring second values selected from the group consisting of current values and voltage values at a second line end of the line and providing the second values with a timestamp; and
following an occurrence of a fault on the line, determining profiles of travelling waves propagating along the line in a direction of the line ends using the timestamped first and second values at both line ends; and
determining the fault location from the profiles of the travelling waves determined for both line ends by defining a time difference with which the travelling waves arrive at the first and second line ends, respectively, the time difference being defined from a pattern comparison of the profiles of the travelling waves determined for the line ends.

2. The method according to claim 1, which comprises carrying out a cross-correlation of the profiles for the pattern comparison of the profiles of the travelling waves.

3. The method according to claim 1, which comprises using an angle of the cross-power spectrum of the profiles of the travelling waves for the pattern comparison.

4. The method according to claim 1, which comprises carrying out a minimization of a target function formed from a difference of the profiles of the travelling waves for the pattern comparison.

5. The method according to claim 1, which comprises, before the pattern comparison, correcting a profile of the travelling wave of at least one line end and thereby taking into account an attenuation of the line.

6. The method according to claim 1, which comprises defining the fault location exclusively using current and voltage values which have been measured at the first and second line ends during an occurrence of a first wave pulse of the travelling wave.

7. The method according to claim 1, which comprises defining the fault location exclusively using either the current values or the voltage values which have been measured at the first and second line ends during an occurrence of a first wave pulse of the travelling wave.

8. The method according to claim 1, which comprises:
filtering the current values and voltage values measured at the line ends, to form first and second filtered current and voltage values which indicate a selected frequency range of the measured current and voltage values; and
defining the profiles of the travelling waves using the first and second filtered current and voltage values.

9. The method according to claim 8, wherein the selected frequency range comprises high-frequency transient components or band-limited transient components of the measured current and voltage values.

10. The method according to claim 8, wherein a filter characteristic of the filter used to filter the current and voltage measured values dampens the frequency ranges in which current and voltage transformers used to measure the current and voltage measured values have measurement errors.

11. The method according to claim 8, which comprises:
where the electrical energy supply network is a multi-phase electrical energy supply network, performing a mathematical transformation in respect of the first and second filtered current and voltage values, to decouple individual phase components, to form first and second transformed current and voltage values; and
defining the profiles of the travelling waves using the first and second transformed current and voltage values.

12. The method according to claim 1, which comprises determining the fault location upon identifying a jump that exceeds a predefined threshold in a characteristic of a value selected from the group consisting of the first current and voltage values, values derived therefrom, the second current and voltage values, and values derived therefrom.

13. The method according to claim 1, which comprises:
determining the fault location in each case by way of a device at each of the first and second line ends; and
outputting the fault locations thus determined with the devices by the devices.

14. The method according to claim 1, which comprises:
determining the fault location with a device configured for the purpose; and
outputting the determined fault location by the device.

15. A device for determining a fault location of a fault on a line of an electrical energy supply network, the device comprising:
a processor configured to determine the fault location of the fault using first values selected from a group consisting of current values and voltage values measured and timestamped at a first line end of the line and second values selected from current values and voltage values measured and timestamped at a second line end of the line following an occurrence of a fault on the line;

said processor being configured to determine profiles of travelling waves propagating along the line in a direction of the line ends when the fault occurs using the timestamped first and second current and/or voltage values at the first and second line ends; and said processor being configured to define the fault location from the profiles of the travelling waves determined for the first and second line ends by defining a time difference with which the travelling waves arrive at the first and second line ends, respectively, wherein the time difference is defined from a pattern comparison of the profiles of the travelling waves determined for the line ends.

16. A system for determining a fault location of a fault on a line of an electrical energy supply network, the system comprising:

two devices each being a device according to claim 15;

a communication connection interconnecting said two devices to one another for data exchange therebetween;

said devices being configured for determining the fault location by carrying out the following process steps:

measuring first values selected from the group consisting of current values and voltage values at a first line end of the line and providing the first values with a timestamp;

measuring second values selected from the group consisting of current values and voltage values at a second line end of the line and providing the second values with a timestamp;

following an occurrence of a fault on the line, determining profiles of travelling waves propagating along the line in a direction of the line ends using the timestamped first and second values at both line ends; and determining the fault location from the profiles of the travelling waves determined for both line ends by defining a time difference with which the travelling waves arrive at the first and second line ends, respectively, the time difference being defined from a pattern comparison of the profiles of the travelling waves determined for the line ends.

* * * * *